United States Patent
Ring et al.

(10) Patent No.: US 11,567,560 B1
(45) Date of Patent: Jan. 31, 2023

(54) PROGRAMMABLE DELAY-BASED POWER STABILIZATION

(71) Applicant: Innovium, Inc., San Jose, CA (US)

(72) Inventors: Keith Michael Ring, Daly City, CA (US); Mohammad Kamel Issa, Los Altos, CA (US)

(73) Assignee: Innovium, Inc., San Jose, CA (US)

( * ) Notice: Subject to any disclaimer, the term of this patent is extended or adjusted under 35 U.S.C. 154(b) by 121 days.

(21) Appl. No.: 16/399,652

(22) Filed: Apr. 30, 2019

Related U.S. Application Data

(60) Provisional application No. 62/665,946, filed on May 2, 2018.

(51) Int. Cl.
| | |
|---|---|
| *G06F 1/32* | (2019.01) |
| *G06F 1/329* | (2019.01) |
| *H03K 5/135* | (2006.01) |
| *G06F 1/324* | (2019.01) |
| *G06F 3/06* | (2006.01) |
| *G11C 29/38* | (2006.01) |
| *H03K 5/00* | (2006.01) |

(52) U.S. Cl.
CPC .............. *G06F 1/329* (2013.01); *G06F 1/324* (2013.01); *G06F 3/0604* (2013.01); *G06F 3/0653* (2013.01); *G06F 3/0659* (2013.01); *G06F 3/0673* (2013.01); *G11C 29/38* (2013.01); *H03K 5/135* (2013.01); *H03K 2005/00019* (2013.01)

(58) Field of Classification Search
None
See application file for complete search history.

(56) References Cited

U.S. PATENT DOCUMENTS

| | | |
|---|---|---|
| 3,839,704 A | 10/1974 | Spencer |
| 5,781,781 A | 7/1998 | Marzolf et al. |
| 7,149,101 B1 | 12/2006 | Om et al. |
| (Continued) | | |

OTHER PUBLICATIONS

"Definition of Router"; computerhope.com; May 13, 2016; retrieved from http://web.archive.org/web/20160513202719/https://www.computerhope.com/jargon/r/router/htm on Apr. 7, 2021 (Year: 2016).

(Continued)

*Primary Examiner* — Fahmida Rahman
(74) *Attorney, Agent, or Firm* — Shield Intellectual Property; Zhichong Gu

(57) ABSTRACT

Power demands of a computing system, such as a network device and/or a component thereof, are stabilized by introducing a programmable delay into identical or substantially similar subsystems within an integrated circuit. Each subsystem reads a potentially different delay value from an associated storage, memory, or input, and waits for some time indicated by the delay value before beginning execution. For example, in a group of identical subsystems that process data concurrently, some or all of the subsystems begin processing their respective data after a different amount of delay, thus staggering their respective executions and lowering the risk of aligned edges when some or all of the subsystems concurrently step their power demands up or down. This, in turn, reduces peak power and voltage. In an embodiment, rather than being fixed at the design stage, each subsystem's delay value is programmable at some point after fabrication.

17 Claims, 11 Drawing Sheets

(56) References Cited

U.S. PATENT DOCUMENTS

| | | | | |
|---|---|---|---|---|
| 7,362,129 | B1* | 4/2008 | Rahman | H03K 17/005 |
| | | | | 326/26 |
| 7,720,105 | B2* | 5/2010 | Colmant | H04L 49/153 |
| | | | | 370/503 |
| 8,654,763 | B2 | 2/2014 | Liu et al. | |
| 9,377,510 | B2* | 6/2016 | Sonawane | G01R 31/318575 |
| 9,829,912 | B2* | 11/2017 | Manabe | G06F 1/12 |
| 2004/0119521 | A1* | 6/2004 | Kurd | H03L 7/091 |
| | | | | 327/291 |
| 2006/0106823 | A1 | 5/2006 | Clark et al. | |
| 2008/0225705 | A1* | 9/2008 | Janarthanan | H04L 43/16 |
| | | | | 370/230 |
| 2008/0279189 | A1* | 11/2008 | Smith | H04L 47/564 |
| | | | | 370/394 |
| 2009/0150708 | A1* | 6/2009 | Kim | H04L 25/14 |
| | | | | 713/503 |
| 2012/0096220 | A1 | 4/2012 | Liu et al. | |
| 2014/0025823 | A1* | 1/2014 | Szabo | H04L 43/16 |
| | | | | 709/226 |
| 2018/0091125 | A1 | 3/2018 | Carlson et al. | |
| 2020/0192456 | A1* | 6/2020 | Sugumar | G06F 1/10 |

OTHER PUBLICATIONS

U.S. Appl. No. 16/374,530, Non-Final Office Action dated Apr. 13, 2021.
Flautner et al., "Drowsy Caches: Simple Techniques for Reducing Leakage Power", Proceedings 29th Annual International Symposium on Computer Architecture, 2002, pp. 148-157 (Year: 2002).
U.S. Appl. No. 16/374,530, Advisory Action dated Nov. 5, 2021.
U.S. Appl. No. 16/374,530, Final Office Action dated Jul. 22, 2021.

\* cited by examiner

FIG. 8    800

PROGRAMMABLE DELAY-BASED POWER STABILIZATION

PRIORITY CLAIM

This application claims benefit under 35 U.S.C. § 119(e) of Provisional Application No. 62/665,946, filed May 2, 2018, the entire contents of which is hereby incorporated by reference as if fully set forth herein.

CROSS-REFERENCE TO RELATED APPLICATION

This application is related to U.S. patent application Ser. No. 16/374,530, entitled "Memory-Based Power Stabilization In A Network Device," by Ring et al., filed Apr. 3, 2019; the entire contents of which are hereby incorporated by reference for all purposes as if fully set forth herein.

TECHNICAL FIELD

Embodiments relate generally to power management, and, more specifically, to techniques for decreasing peak power requirements in a device.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

As the capabilities and numbers of components in computing devices grow, the power requirements of these devices tend to grow, as well. Since utilization of these capabilities and components changes over time, the amount of power consumed by the device also tends to change over time. For example, a networking device, such as a switch or router, may consume very little power when the device is not receiving much network traffic and/or when advanced packet processing is not needed or enabled. But when a large amount of traffic is received, and/or when the device is instructed to perform more advanced packet processing on that traffic, the power consumed by the device may increase greatly, and then decrease when the traffic subsides or the advanced packet processing is no longer needed.

Devices and components may be rated by a number of different power-related metrics, including average power, idle power, and peak power. Much progress has been achieved in reducing idle power and average power for many types of system components. However, system designs continue to be complicated by peak power demands. For example, modern integrated circuits and processors can be particularly power-hungry components when providing advanced capabilities and/or processing large amounts of data at potentially very high clock frequencies.

The peak power rating of a device and its individual components is a significant design consideration, in that a device and/or its components must be able to provide at least the peak power, or risk intermittent failures. If the peak power needed for a certain desirable component is not available to the device (e.g. due to the power demands of other device components), the device must instead be designed to utilize a less power-hungry component, even if the less power-hungry component lacks certain desirable features or performance characteristics. Simply increasing the peak power available to the device or component is often not a viable solution, on account of associated expenses, space constraints, and/or other concerns. Hence, the peak power demands of a system component can make the difference between a commercially viable product and a non-commercially viable product.

Moreover, periods of peak power are often correlated with brief periods of time in which the voltage of a device droops or spikes (also known as voltage "transients"). Computing devices, and components thereof, must be designed to briefly tolerate or otherwise protect themselves from the minimum and maximum voltages that they can expect to receive during voltage droops and spikes. Generally, the higher the magnitude of the expected voltage droops or spikes, the more complicated the design and/or production of a device or component. The increasing complications may include, for instance, the addition of internal elements to deal with the voltage droops and spikes, the imposition of certain configuration limitations, increased testing costs as a result of more checks and/or design iterations before sign-off, increased production costs from the use additional or costlier materials, and so forth. The need to handle larger voltage spikes can even rule out designs that would otherwise lead to higher performance or increased functionality.

BRIEF DESCRIPTION OF THE DRAWINGS

The present inventive subject matter is illustrated by way of example, and not by way of limitation, in the figures of the accompanying drawings and in which like reference numerals refer to similar elements and in which.

DETAILED DESCRIPTION

Figure 1:
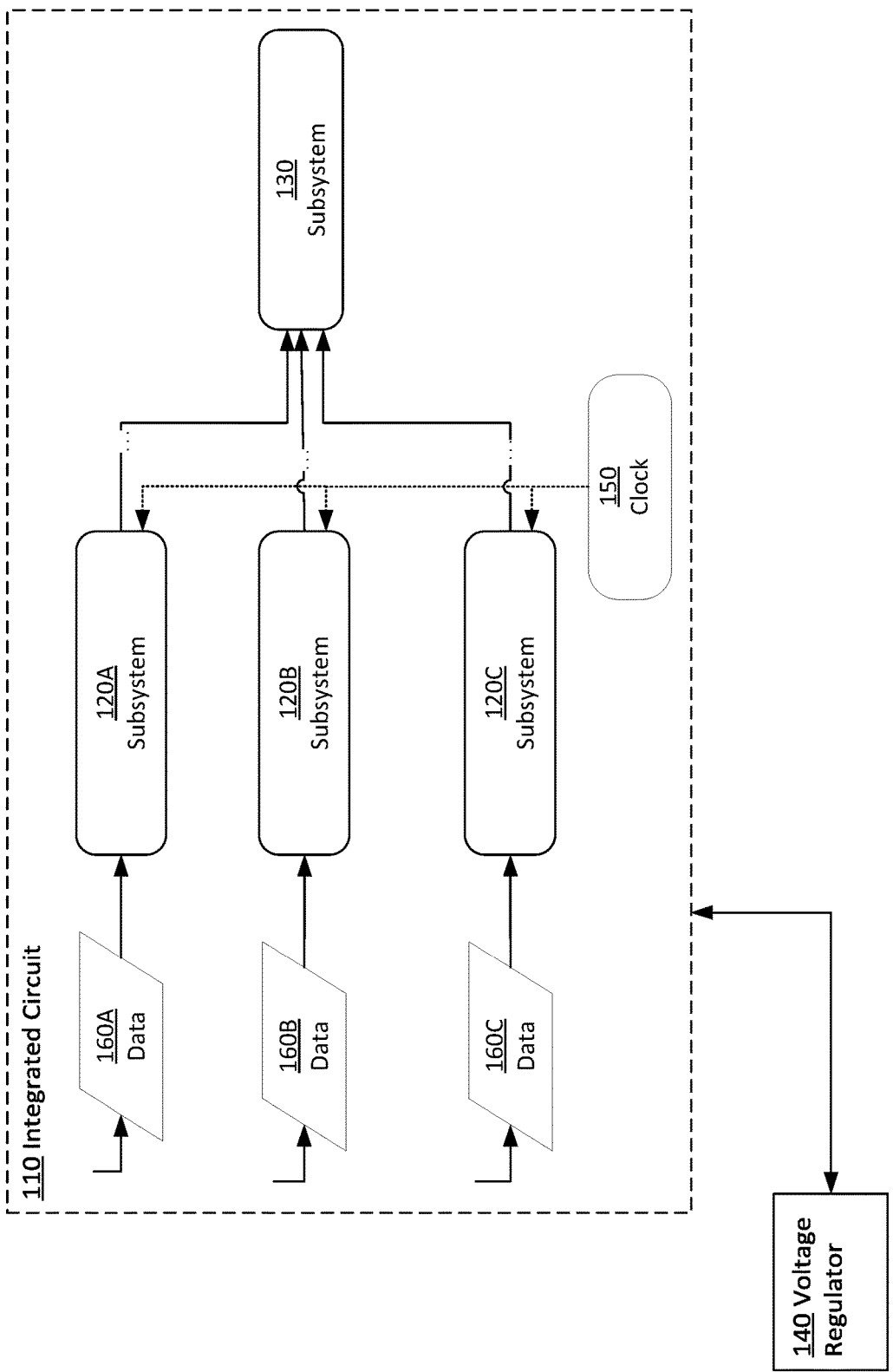
FIG. 1 is an illustrative view of various aspects of an example system.

In the following description, for the purposes of explanation, numerous specific details are set forth in order to provide a thorough understanding of the present inventive subject matter. It will be apparent, however, that the present inventive subject matter may be practiced without these specific details. In other instances, well-known structures and devices are shown in block diagram form in order to avoid unnecessarily obscuring the present inventive subject matter.

Embodiments are described herein according to the following outline:

1.0. General Overview
2.0. Structural Overview
  2.1. Integrated Circuit
  2.2. Voltage Regulator
  2.3. Clock
  2.4. Congruent Subsystems
  2.5. Programmable Delay
  2.6. Programmable Delay Presets
  2.7. Example Subsystem with Programmable Delay
  2.8. Miscellaneous
3.0. Functional Overview
  3.1. Programmatically Delaying Execution of a Subsystem
  3.2. Identifying an Optimal Preset for a Chip
  3.3. Programming a Preset Based on Chip Characterization
4.0. Example Embodiments
5.0. Example Implementation Mechanism
  5.1. Network System
  5.2. Network Device
  5.3. Computer Hardware Overview
6.0. Extensions and Alternatives

1.0. General Overview

Approaches, techniques, and mechanisms are disclosed for stabilizing the power demands of a computing system, such as a network device and/or a component thereof, by introducing a programmable delay into identical or substantially similar subsystems within an integrated circuit. Each subsystem reads a potentially different delay value from an associated storage, memory, or input, and waits for some time indicated by the delay value before beginning execution. Thus, for example, in a group of identical subsystems that process data concurrently, some or all of the subsystems begin processing their respective data after a different amount of delay, thus staggering their respective executions and lowering the risk of aligned edges when some or all of the subsystems concurrently step their power demands up or down. This, in turn, reduces peak power and voltage.

In an embodiment, rather than being fixed at the design stage, each subsystem's delay value is programmable at some point after fabrication of a chip that implements the integrated circuit. In an embodiment, different sets of delay values for the subsystems may be inputted while executing one or more sample loads. For each set of delay values, also referred to as a delay preset, various metrics may be measured, such as peak power and/or voltage, error rates, and so forth. Based on these metrics, one or more high-performing sets of delay values may be selected. The selected set may then be programmed into the system prior to shipping and/or for deployment in a production setting.

In an embodiment, rather than performing the foregoing for each fabricated chip that implements the integrated circuit, one or more sample chips may be selected from a group (e.g. a bin, a set of chips having similar performance characteristics, etc.) of chips after fabrication. A set of values may be selected for the group by applying the foregoing technique to the one or more sample systems. The set of values may then be programmed into each system in the group.

In an embodiment, other high-performing sets of delay values may also be noted. In the event real-world performance of a system with one set of delay values is not satisfactory (e.g. because of differences between the sample load and the real-world load of the system, because of aging of the hardware, etc.), one or more of these other higher-performing sets of delay values may be programmed into the system instead.

In some embodiments, the techniques are particularly advantageous with network devices, such as switches or routers, processing large numbers of data packets. In some embodiments, the techniques nonetheless provide advantages in other types of systems as well. In other aspects, the inventive subject matter encompasses computer apparatuses and/or computer-readable media configured to carry out the foregoing techniques.

2.0. Structural Overview

FIG. 1 is an illustrative view of various aspects of an example system 100, according to an embodiment. System 100 is a computing device, such as a network switch or router, gateway, server, or any other suitable computing apparatus.

2.1. Integrated Circuit

System 100 includes an integrated circuit 110. Integrated circuit 110 may be, for example, an application specific integrated circuit (ASIC), field-programmable gate array (FPGA), microprocessor, or any other suitable integrated circuit.

Integrated circuit 110 may include a variety of subsystems—also referred to as subchips or "blocks"—configured to provide a variety of functionality, including, without limitation, data processing logic, data manipulation logic, I/O logic, general-purpose processing logic, and so forth. In an embodiment where system 100 is part of a networking device, for example, the subsystems may include specialized logic such as forwarding logic, traffic management logic, packet manipulation logic, prefix table lookup logic, and so forth.

An integrated circuit may be divided into subsystems at various levels of granularity. Some subsystems may comprise a small handful of logic gates, memories, registers, multiplexors, or other electronic elements, while other subsystems may comprise hundreds, millions, or even greater numbers of electronic elements. Moreover, some subsystems may comprise any number of discrete, smaller subsystems, which may in turn themselves comprise yet smaller subsystems, and so forth.

Each of the subsystems in integrated circuit 110 demands power to perform its respective operations, and the amount of power consumed at any given time by a given subsystem may vary depending on what operations the given subsystem is currently performing. For instance, a subsystem may be in a low or idle-power state, in which it is performing relatively few or even no operations, and thus drawing minimal current. This subsystem may, in response to input from other subsystems, begin performing more and more operations and/or relatively processing-intensive operations, and thus begin drawing higher amounts of current. The current drawn by the subsystem is often a function of the number of operations being performed by a subsystem and/or the complexity of the operations performed. The current drawn by the integrated circuit is, in turn, the sum of the current drawn by its constituent subsystems.

2.2. Voltage Regulator

Like many electrical components, integrated circuit 110 (or at least some of its constituent subsystems) requires a stable voltage to operate, usually referred to as the nominal voltage of the integrated circuit 110. Although minor variations in the operating voltage (e.g., less than 10%) are typically tolerated, larger variations can disrupt the operation of, or even destroy, the integrated circuit 110.

However, without adjusting the power usage of an integrated circuit 110, a change in the current draw of the integrated circuit 110 (e.g. as a result of a subsystem suddenly requiring more or less power to handle an increasing or decreasing workload) would require an inversely proportional change to the voltage, which would of course impact the stability of the voltage.

Accordingly, integrated circuit 110 is coupled to a voltage regulator 140. Voltage regulator 140 may take a variety of forms, such as a voltage regulator module. Voltage regulator 140 is configured to receive power from a power supply (not depicted) and provide that power to integrated circuit 110. Voltage regulator 140 provides that power at an approximately same voltage (i.e. the nominal voltage) the vast majority of the time. This voltage may be pre-configured, and/or set by a voltage identifier sent to the voltage regulator 140 by voltage identification logic within the integrated circuit 110.

Voltage regulator 140 is further configured to permit the integrated circuit 110 to draw variable amounts of current from the voltage regulator 140. To maintain voltage at or near the nominal voltage as the current demanded by integrated circuit 110 changes, voltage regulator 140 is configured with voltage sensing logic and a control loop to monitor and adjust the voltage being provided to integrated circuit 110 so that the voltage remains stable over time. Thus, for instance, a voltage regulator 140 may sense that, due to a step up in the current load demanded by the integrated circuit 110, the voltage being provided is decreasing. The voltage regulator 140 may then raise the voltage to compensate for the increased load, by increasing the power supplied to the integrated circuit 110.

Even with voltage regulator 140, however, a change in the current drawn by integrated circuit 110 leads to temporary voltage transients during the short period between the time when the current draw changes and the time when the voltage regulator 140 senses a change in voltage and compensates accordingly. In integrated circuits 110 where the current draw may change significantly in a very short period of time, the minimum or peak voltage reached during such a voltage transient can be particularly lower or higher, respectively, than the nominal operating voltage of the device. This problem is exacerbated even further in a high power integrated circuit 110. High quality voltage regulators 140 that sense and respond to voltage changes more quickly are expensive and consume valuable space. Even then, the magnitudes of voltage transients are merely reduced rather than eliminated.

Thus, even if the voltage regulator 140 is capable of stabilizing voltage quickly, computing devices, and components thereof, must still be designed to briefly tolerate or otherwise protect themselves from the minimum and maximum voltages that they can expect to receive during periods of changing current draw. For example, there may be a number of decoupling capacitors through which the current from the voltage regulator 140 must pass. Of course, larger and/or longer-lasting voltage transients demand greater and greater numbers of such capacitors.

2.3. Clock

The subsystems of an integrated circuit operate in accordance to one or more clocks, such as clock 150. A clock controls the timing of operations for a set of subsystems connected to the clock. Each clock emits a clock signal, which is a type of signal that oscillates between a high state and a low state, and is utilized like a metronome to coordinate actions of the subsystems. A subsystem connected to the clock becomes active on one or both edges of the clock signal. Each operation performed by the subsystem may take one or more clock cycles to complete.

Moreover, there may be multiple clocks in a system. Some subsystems may utilize one clock, while others may utilize other clocks. In the case of subsystems that are themselves components of larger subsystems, the larger subsystems may utilize a different (and slower) clock than their constituent components. Two subsystems that are synchronized to a same clock are said to be clocked together.

2.4. Congruent Subsystems

The subsystems in an integrated circuit may include sets of identical or similar subsystems that are clocked together and frequently execute the same logic at the same time, particularly when operating on similar inputs (e.g. in the case of a network device, similar data packets or portions thereof).

For example, the subsystems depicted in integrated circuit 110 include subsystems 120A-C (collectively subsystems 120), which are coupled to a common clock 150. Subsystems 120 process various input data 160A-C (collectively data 160) in parallel. Subsystems 120 are identical or substantially similar, except that each accepts a different data input 160. Each subsystem 120 performs the same, or substantially the same, sequence of one or more operations based on their respective inputs 160 (and, optionally, based on other inputs). Results of these sequences of operations are output from their respective subsystems 120 to other subsystems of integrated circuit 110.

For purposes of this application, two subsystems are considered to be substantially similar if, given a same input value, they perform a same sequence of operations with respect to that input value (regardless of whether they may perform any other additional operations, or a different sequence of operations for other input values).

For instance, in an embodiment where integrated circuit is, or is part of, a network device, subsystems 120 might be parallel components of the forwarding logic of the network device, including, without limitation, parallel traffic managers, packet processors, memory or storage subsystems, pipelines, interconnects, and so forth. Of course, these are but examples of types of subsystems 120, and in other embodiments and devices subsystems 120 may be of any other suitable type.

Optionally, subsystems 120 may output data into data flows or channels that eventually converge as input into a common subsystem 130, also referred to as converging subsystem 130. The outputs may, however, be processed separately at one or more intermediate subsystems (not depicted) before arriving at converging subsystem 130. In yet other embodiments, the data need not be output into flows or channels that converge.

Because they are often performing the same operations at the same time, the power demands of subsystems 120 often coincide. For example, if subsystems 120A, 120B, and 120C are each executing on data 160 with similar characteristics, then they may each make the exact same decisions with respect to that data 160. The result is that subsystems 120 may execute their most power-intensive logic at the exact same time, and thus require peak power simultaneously. Moreover, if subsystems 120A, 120B, and 120C all complete their respective operations at the same time, then they will become idle simultaneously. Consequently, their "edges"—i.e. periods of rising or falling power consumption—will often align, thus creating large voltage transients.

Figure 2:
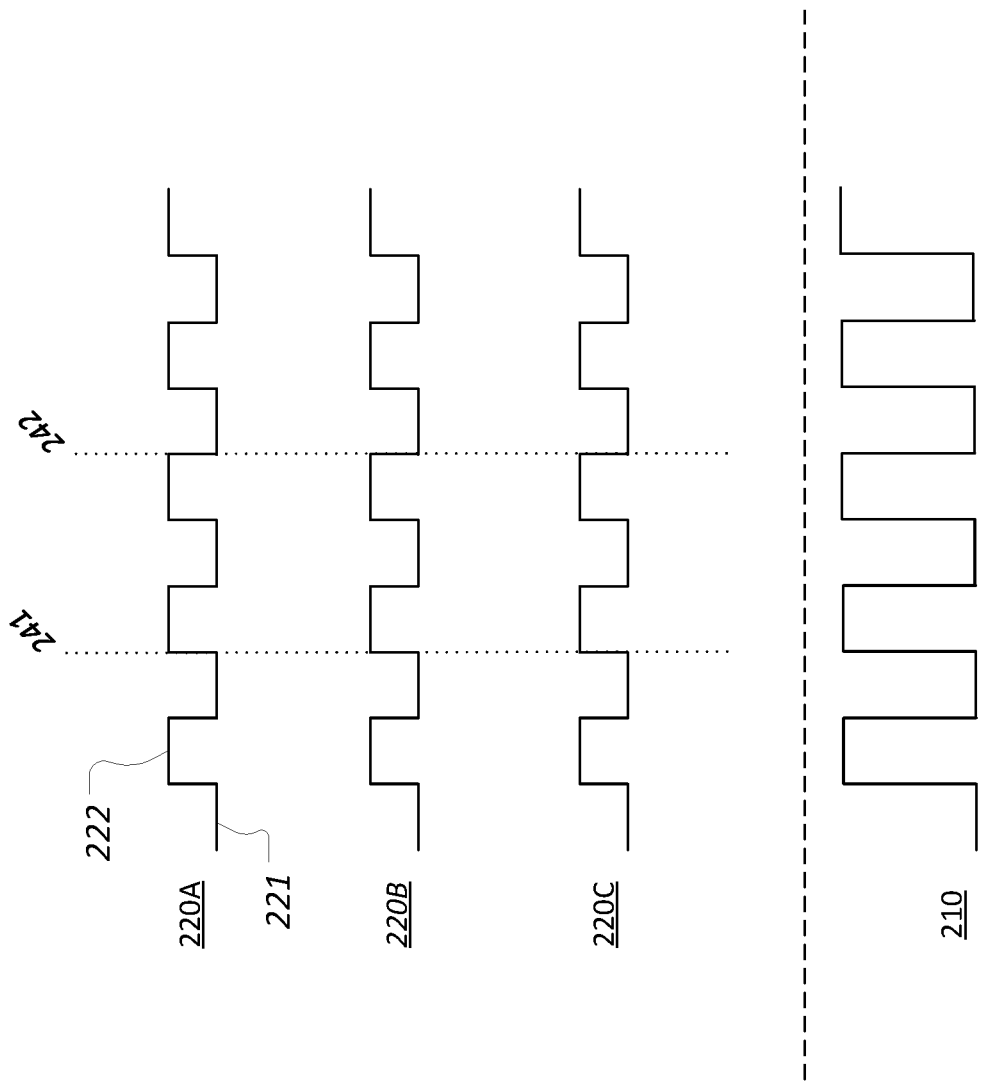
FIG. 2 illustrates example coinciding clock graphs for a set of identical or substantially similar subsystems, leading to increased peak power.

FIG. 2 illustrates example coinciding clock graphs 220 for a set of identical or substantially similar subsystems 120, leading to increased peak power, according to an embodiment. Graphs 220A-220C correspond to power consumption over time for subsystems 120A-120C, respectively. The subsystems 120 oscillate between periods of high power consumption 222 and periods of low power consumption 221. The example graphs 220 illustrate a period of time wherein, on account of data inputs 160 with similar characteristics, subsystems 120 are performing the same operations at the same time. Hence, for example, at time 241, each subsystem 320 suddenly begins drawing a high amount of current, while at time 242, each subsystem suddenly stops drawing that current.

Graph 210, meanwhile, illustrates the net effect of all three subsystems 120 on the overall power consumption of the integrated circuit 110. Clearly, the difference in current drawn immediately prior to time 242 and immediately after time 242 is significant, with the consequence being a relatively large voltage spike, which the integrated circuit 110 must be equipped to handle.

Staggering execution of the logics of identical or similar subsystems can misalign these edges, therefore smoothing out power consumption. Thus, one may attempt to design integrated circuit 110 in such a manner that execution of similar or identical subsystems 120 is staggered randomly or in accordance to a pattern. However, simply staggering execution randomly or in accordance to a pattern fixed at the design stage is not typically feasible, in that it results in unpredictable behavior wherein data outputs are not ready when needed. That is, certain subsystems downstream from subsystems 120, such as subsystem 130, may be configured to expect data inputs at specific times (e.g. after a certain number of clock cycles), and will consequently act upon inconsistent data if one or more subsystems 120 are delayed beyond this time.

For example, converging subsystem 130 may be configured to expect to receive inputs from each of subsystems 120A-C within a specific time frame, so that converging subsystem 130 may perform some operation (e.g. comparison, summation, etc.) on these inputs at the end of this time frame. If a particular data input 160C requires subsystem 120C to perform a set of operations that takes the maximum amount of time that a subsystem 120 is expected to process data, and the subsystem 120 is randomly delayed by a certain amount of time, then subsystem 120C will not produce a valid output within the time frame expected by converging subsystem 130. Converging subsystem 130 would thus begin performing its operation on invalid data from subsystem 120C.

2.5. Programmable Delay

Figure 3:
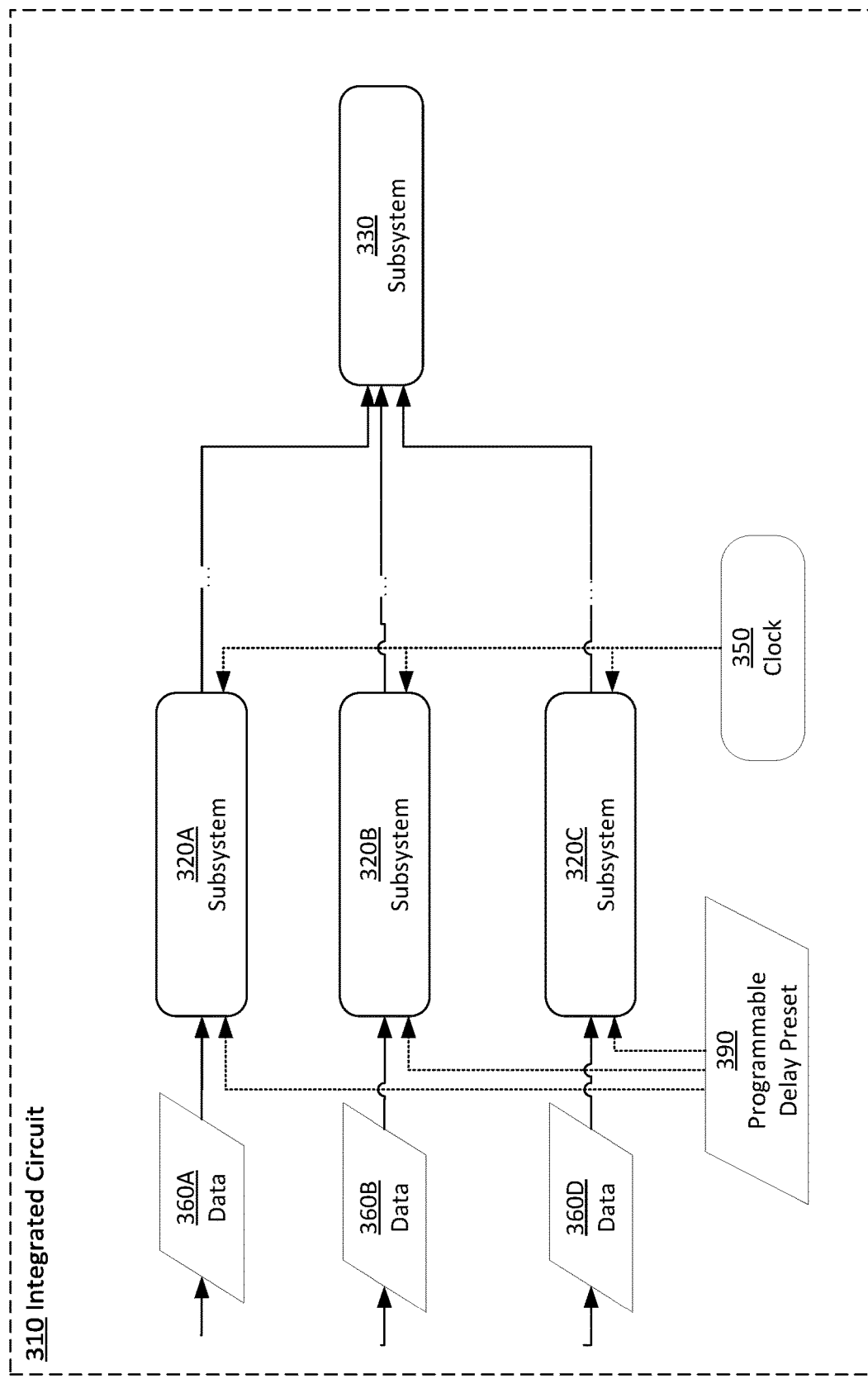
FIG. 3 is an illustrative view of various aspects of an example system in which the techniques described herein may be practiced.

FIG. 3 is an illustrative view of various aspects of an example system 300 in which the techniques described herein may be practiced, according to an embodiment. System 300 is similar to system 100. For instance, system 300 includes an integrated circuit 310 comprising data inputs 360, subsystems 320, subsystem 330, and clock 350. These correspond to data inputs 160, subsystems 120, subsystem 130, and clock 150 of integrated circuit 110, respectively. For ease of illustration, no voltage regulator 140 is depicted.

However, integrated circuit 310 is improved in aspects. According to an embodiment, identical or substantially similar subsystems, such as subsystems 120/320, may be configured to support a programmable delay. Thus, each subsystem 320 reads or otherwise accepts a programmable delay value from a programmable delay preset 390. Each subsystem 320 delays execution of its logic for an amount of time associated with its delay value (e.g. a number of cycles of clock 350).

The set of delay values is collectively known as a programmable delay preset 390, and may be stored in any suitable non-volatile memory or memories. The preset 390 may refer collectively to all programmable delay values used by an integrated circuit, even for other (e.g. not depicted in FIG. 3) sets of identical or substantially similar subsystems.

Significantly, programmable delay values are not fixed absolutely, but may be programmed or even reprogrammed after design and fabrication of the integrated circuit 310. Programmable delay values may then be selected based on unique properties of the individual integrated circuit 310 and/or context in which the integrated circuit 310 is deployed. That is, each different circuit 310 may have its own preset 390 optimized for that specific circuit 310.

In an embodiment, system 300 may further comprise a subsystem configured to write and/or update the preset 390 in the corresponding memory or memories. For instance, a Basic Input/Output System (BIOS), or other suitable interface, may be provided that allows for programming the preset 390. The interface may or may not require direct interaction with a user, depending on the embodiment. For example, in some embodiments, the preset 390 may be programmed by a user via a command console or using a network configuration tool. As another example, the preset 390 may be programmed by an internal or external application configured to automate programming of the preset 390.

According to an embodiment, one may program the delay values in such a manner as to leverage variations in the physical properties of the substrates upon which integrated circuits such as integrated circuit 310 are formed. Due to these variations, which cannot be predicted and designed around before fabrication, different subsystems are often found to run faster or slower than other subsystems. Such may be the case in the set of identical or substantially similar subsystems clocked to each other. Each integrated circuit 310 is formed on a different die, and each die may have different properties. For instance, on one die, the portion of the die on which subsystem 320A is implemented may run faster than the portion of the die on which subsystem 320C is implemented, while on another die, the reverse may be true.

Thus, though logically identical, the physical characteristics of different subsystems 320 on different chips (i.e. different dies on which integrated circuit 310 is formed) may be such that many subsystems 320 are actually fast enough to safely execute their respective operations in the allotted time, even after a certain amount of delay. The amount of delay that is tolerable is simply a matter of exactly how fast the subsystem 320 executes.

Put another way, usually the amount of time a subsystem 320 is designed to execute in is based on worst case assumption about the physical characteristics of the portion of the die on which subsystem 320 is implemented. Those subsystems 320 that are proven to be capable of running faster than designed, as a consequence of having been implemented on a faster portion of the die, can therefore be delayed by amounts proportional to their speeds.

Among other effects, then, the programmable delay value allows for the staggering of execution of subsystems 320 in such a manner that the integrity of their outputs is not compromised by the delay. Delay values may be chosen for a set of subsystems 320, to the extent supported by the specific die, such that different subsystems 320 begin execution at different times, thus offsetting peak power demands of the subsystems 320.

Figure 4:
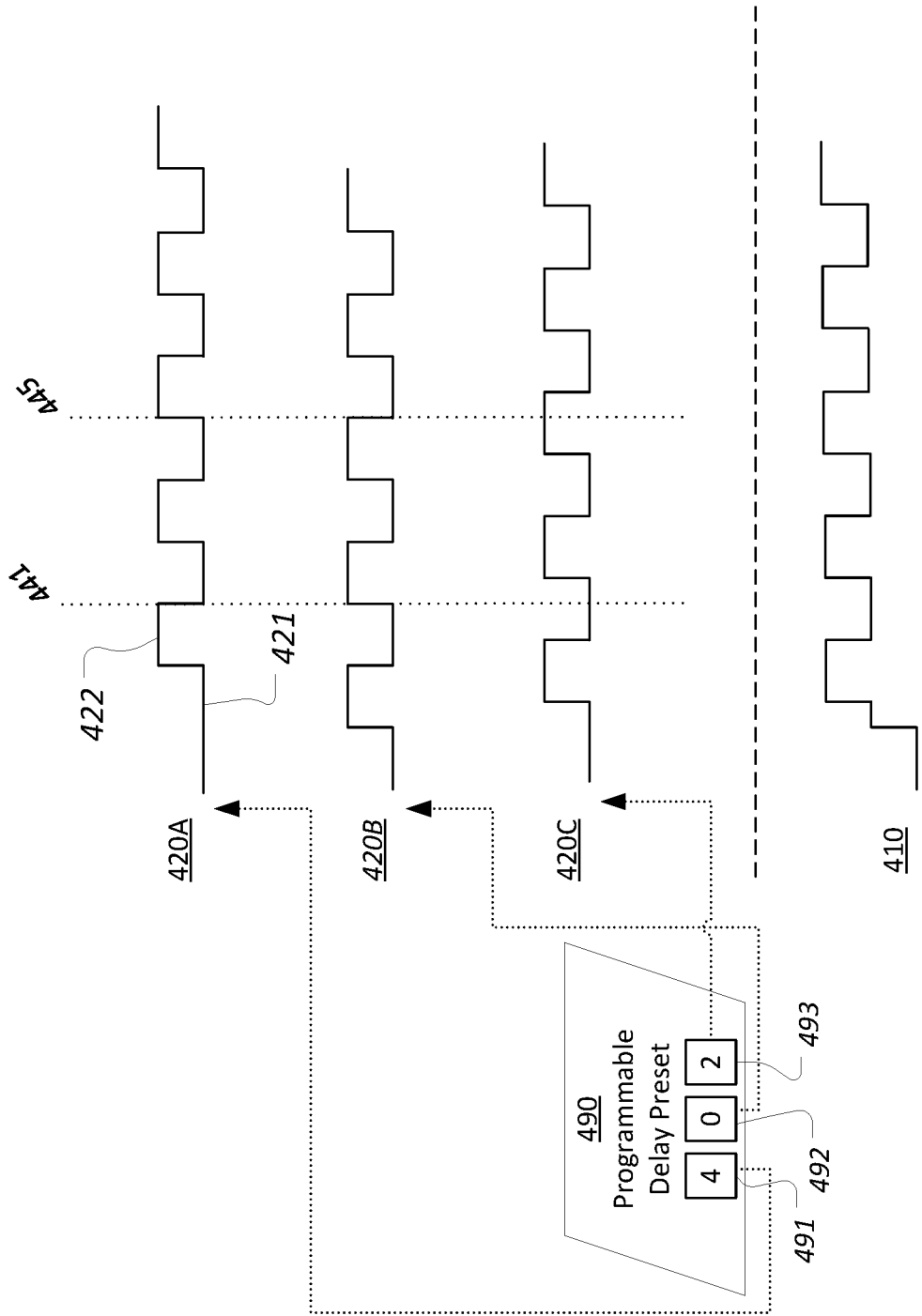
FIG. 4 illustrates the effect of using of programmable delay values, with respect to the graphs of FIG. 2.

FIG. 4 illustrates the effect of using of programmable delay values, with respect to the graphs of FIG. 2, according to an embodiment. Graphs 420A-420C correspond to power consumption over time for subsystems 320A-320C, respectively. As with subsystems 120, subsystems 320 oscillate between periods of high power consumption 422 and periods of low power consumption 421. As with the example graphs 220, the example graphs 420 illustrate a period of time wherein, on account of data inputs 360 with similar characteristics, subsystems 320 are performing the same operations.

However, on account of subsystems 320 delaying execution of their respective operations in accordance to the programmable delay preset 490 (an example of programmable delay preset 390), the power demands of subsystems 320 are not aligned. For example, subsystem 320A delays execution of its logic by an amount of time corresponding to the programmable delay value 491, while subsystem 320B does not delay execution of its logic at all, on account of its programmable delay value 492 being 0. Consequently, as illustrated by graph 420A, the power consumption demands of subsystem 320A are offset relative to those of subsystem 320B.

Similarly, the programmable delay value 493 instructs subsystem 320C to delay execution by a different amount than subsystem 320A. Thus, the power demand graph 420C is offset by different amounts of time than 420A and 420B.

Hence, for example, at times 441 and 445, the edges of graphs 420 are not aligned, in contrast to graphs 220 at times 241 and 245. Graph 410 illustrates the net effect of all three subsystems 320 on the overall power consumption of the integrated circuit 310. In contrast to graph 310, the difference between peak power consumption at any given time does not change nearly as significantly, thus lowering the magnitude of any resulting voltage spike or voltage droop.

2.6. Programmable Delay Presets

The actual programmable delay preset 390 used for a given chip may be selected in a variety of manners. By default, each delay value may be pessimistically assigned to 0 when designed, and then reprogrammed after fabrication with more optimal values.

Generally speaking, each delay value in the preset 390 may be selected based on the maximum possible amount of time the corresponding subsystem 320 may be delayed and still safely produce its output within the time frame expected. The delay value should be based on a worst-case scenario—i.e. the maximum possible amount of time the subsystem 320 needs to perform its operations on any given data input 360.

As mentioned above, in some cases, the output of a subsystem 320 flows through one or more intermediate subsystems before converging with the outputs of the other subsystems 320 at a converging subsystem 330. In some such embodiments, the maximum possible delay may further reflect the speeds of these intermediate subsystems, such that the output of a subsystem 320 may be further delayed so long as the intermediate subsystems are fast enough to process the data within the time frame expected by the converging subsystem 330.

However, a subsystem 320 need not necessarily be delayed by its maximum possible delay, particularly if other subsystems 320 have similar maximum possible delays. This is because it is desirable that different subsystems 320 be staggered relative to each other. Hence, for example, if subsystems 320A and 320C both support delays of 4, one of the subsystems may be assigned another delay value, such as 2, so that both are not executing exactly in parallel.

In an embodiment, instead of actually computing the maximum possible delay of each individual subsystem 320, an optimal preset 390 may be determined through systematic testing of possible combinations of delay values. For instance, in an embodiment, one may test various presets 390 on a given system 100 while processing an example data set (e.g. for a network device, actual or simulated network traffic). With each preset 390 tested on a chip, various metrics may be tracked, and a preset 390 that results in a desired set of measurements may be selected for the chip.

Such metrics may include, for example, a number or frequency of data processing errors. Data processing errors may indicate that the delay value chosen for a specific subsystem 320 is overly aggressive, in that it does not allow a safe margin of time for the specific subsystem 320 to finish execution before its output is needed. In an embodiment, if a preset results in any data processing errors, it is not selected.

Other metrics may include, for example, the peak voltage and/or minimum voltage observed for the integrated circuit 310 while utilizing the preset 390. To measure this voltage, in an embodiment, an ammeter may be deployed between the integrated circuit 310 and its voltage regulator. In an embodiment, assuming a preset 390 does not result in an intolerable amount of errors, the preset 390 with the smallest deviation between the nominal voltage of the integrated circuit 310 and the minimum and/or maximum voltages is selected for a given chip.

Such testing may be performed by a variety of entities, depending on the context in which integrated circuit is designed, fabricated, packaged, and/or deployed. For instance, after fabrication of a chip, the designer of the integrated circuit may test various presets on the chip and program the chip with a selected preset. Similarly, after a chip is delivered to a designer of a system 300 in which the chip is utilized, the system designer may perform its own testing and programming of the chip. An end-user might even perform such testing and programming on site, after the system 300 is already deployed.

In an embodiment, rather than performing such testing for each and every chip produced, sample chips having different characterizations may be tested. For instance, chips may be binned or otherwise grouped by their properties. In an embodiment, a chip may include a process monitor, such as a ring oscillator, by which it characterizes the properties of its substrate. Based on these characterizations, the chip may be classified into a characterization group.

It may, in an embodiment, be presumed that chips that are in the same characterization group will perform similarly with the same programmable delay preset 390. Hence, once a preset 390 has been selected for one chip in the group, it may be programmed into each other chip in the group as well. Optionally, a set of high performing presets may be tracked for the group. If one of the high-performing presets does not produce the desired results for a certain chip in the group, the chip may be reprogrammed with another one of the high-performing presets.

Group-based programming of the chip may be performed either before the chip is shipped to the end-user, or by the end-user directly. For instance, an end user may contact the chip supplier with measurements and/or identifiers that indicate the chip's characterization. The chip supplier may then identify a high-performing preset 390 for a chip having that characterization and send that preset back to the end user. The end user may then program the chip with the preset 390.

Moreover, this process may be automated. For instance, a system 300 may be configured to execute an automatic initialization process by which it characterizes integrated circuit 310, sends the characterization data to a server, receives a preset from the server, and sets its preset 390 to the received preset. Or, as another example, the system 300 may be configured to gradually fine-tune its preset 390 until certain threshold metrics are achieved.

In an embodiment, it is generally assumed that once a chip has been programmed with an optimal preset 390, it will operate with that preset 390 for a significant amount of time, or even the lifetime of chip. Nonetheless, in some embodiments, a chip may be reprogrammed with different presets 390 in response to various events over time, such as changing performance of the chip as it ages, or changes to the environment in which the system 300 is deployed (e.g., temperature deltas). In an embodiment, the chip may even be reprogrammed much more frequently, such that its preset 390 changes many times over the course of a week, day, or any other suitable period of time.

2.7. Example Subsystem with Programmable Delay

Figure 5:
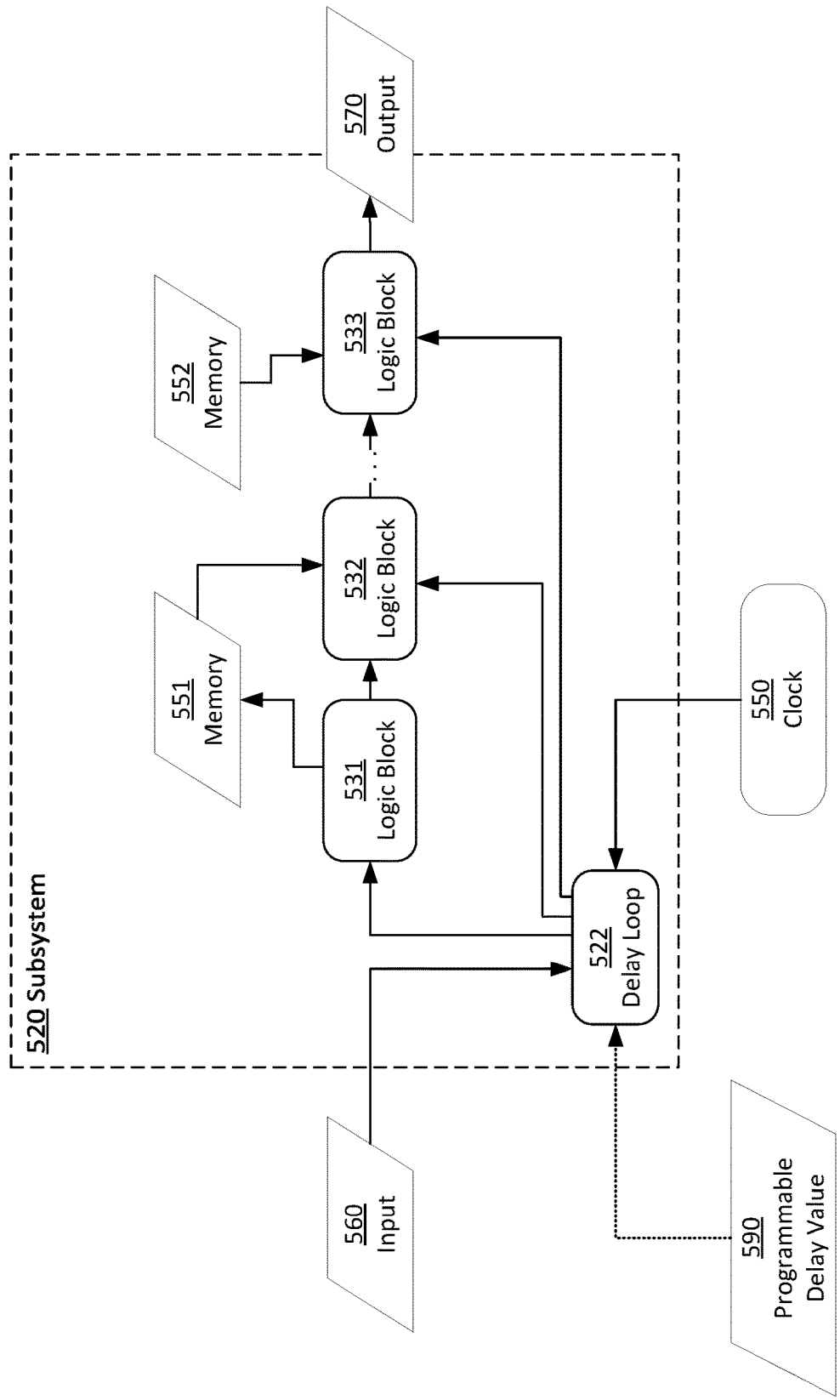
FIG. 5 illustrates an example programmatically delayable subsystem.

FIG. 5 illustrates an example programmatically delayable subsystem 520, according to an embodiment. A system 500 may have a plurality of subsystems 520, each having the same or similar components. In an embodiment, subsystem 520 is an example of a subsystem 320, and system 500 is therefore the same as system 300 or integrated circuit 310. However, in other embodiments, system 500 may be different from system 300 and integrated circuit 310.

Subsystem 520 includes a plurality of logic blocks 531-533 coupled to memories 551-552. Logic blocks 531-533 may be any sort of suitable electronic element, including, without limitation, transistors, diodes, multiplexors, logic gates, and so forth. Although only three logic blocks are depicted, a subsystem 520 may in fact have any number of logic blocks 531-533, including just one, or significantly more.

Memories 551-552 may be any suitable memory, including random access memory, read-only memory, content addressable memory, a register, and so forth. A subsystem 520 may include any number of memories 551-552, including one or even none. A logic block 531-533 may likewise be coupled to any number of memories 551-552. Moreover, a logic block 531-533 may be coupled to one or more memories or other components external to subsystem 520, from which it reads or requests data.

As depicted, logic blocks 531-533 are arranged in a sequence, with the outputs of one or more logic blocks 531-533 serving as inputs of other logic block 531-533. However, the logic blocks 531-533 need not be arranged entirely serially, but may in fact branch and/or run partially in parallel. Logic blocks 531-533 each perform one or more operations based on their respective input data and/or coupled memory 551-552.

Subsystem 520 receives input data 560, such as inputs 160/360. This input data is fed into the first logic block 531 in the sequence.

Subsystem 520 further comprises a delay line component 522. The delay line component 522 reads or otherwise accesses a programmable delay value 590 assigned to subsystem 520 by a programmable delay preset, such as preset 390. The delay line 522 may be any suitable component for inducing a delay, such as a digital delay lock loop. The amount of delay induced is a function of the programmable delay value 590. For instance, the programmable delay value 590 may be a number of clock cycles of delay to induce. To this end, delay line 522 is coupled to a clock 550. Clock 550 is similar to clocks 150/350 described above, and controls the timing of execution of each subsystem 520 through a control signal.

Subsystem 520 is configured to execute the delay line 522 before relaying the control signal to any of logic blocks 531-533, therefore staggering processing of input 560 relative to other similar subsystems 520. Each subsystem 520 in a system 500 may potentially have a different programmable delay value 590.

In an embodiment, the amount of delay that the value 590 causes delay line 522 to introduce should be small enough that subsystem 520 is still capable (on account of its physical characteristics) of delivering its output 570 within the same time frame expected of each of the other subsystems 520 in system 500. Or, in embodiments where data flow does not converge until a subsystem further downstream, the delay may be greater, so long as the data path through which output 570 flows and eventually converges with other outputs 570 is fast enough that the data arrives at the converging component within the expected time frame.

2.8. Miscellaneous

FIGS. 1 and 3 depict only some of the many possible components of a system 100/300 in which the techniques described may be implemented. Systems 100/300 may include a variety of undepicted subsystems in varying arrangements, including other subsystems that utilize clock 150/350, as well as one or more other clocks. Some of these subsystems may input other forms of data 160/360. There may be other sets of identical or substantially similar subsystems 120/320. While only three subsystems 120/320 are depicted in FIGS. 1 and 3, a set of subsystems 120/320 may in fact include any number of subsystems 120/320, including just a single subsystem 120/320.

Moreover, the power consumption graphs of FIGS. 2 and 4 are likely oversimplified for most embodiments, as they are merely illustrative for purposes of explanation. For example, subsystems 120/320 may have more complicated power demands over time, which may involve more levels of power demand than two, and these power demands need not repeat in any predictable pattern. Likewise, periods of idle power and peak power need not occur with the same frequency or duration. The effects of the techniques described herein are nonetheless the same, regardless of the exact power consumption graphs, in that the techniques tend to average out power consumption for a set of identical or substantially similar subsystems over time.

Furthermore, FIG. 5 illustrates only one example of a subsystem whose execution may be delayed programmatically according to the described techniques. Other subsystems may have additional or fewer components, in varying arrangements.

In an embodiment, the techniques described herein may be used with respect to any arbitrary set of subsystems in an integrated circuit, regardless of whether the subsystems are substantially similar or identical, or even necessarily clocked together. For example, the techniques may be utilized to reduce voltage spikes from a group of concurrently executing subsystems that frequently begin or cease executing power-intensive operations at the same time. If these subsystems are implemented on portions of the substrate that have different physical characteristics, then it may be possibly to stably delay one of the subsystems using a programmable delay value, assuming the subsystems have been configured to implement a programmable delay.

3.0. Functional Overview

3.1. Programmatically Delaying Execution of a Subsystem

Figure 6:
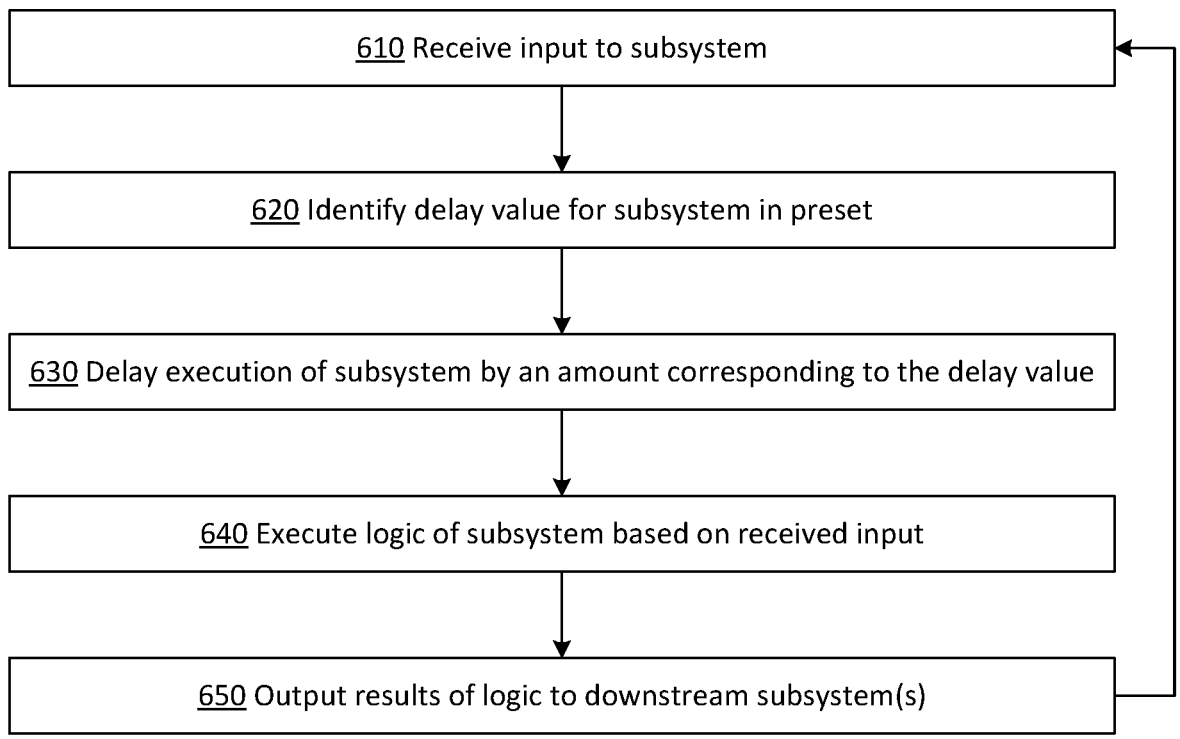
FIG. 6 illustrates an example flow for programmatically delaying execution of a subsystem.

FIG. 6 illustrates an example flow 600 for programmatically delaying execution of a subsystem, according to an embodiment. The various elements of flow 600 may be performed in a variety of systems, including systems such as system 300 described above. In an embodiment, each of the processes described in connection with the functional blocks described below may be implemented using digital logic in any of a general-purpose computer or a special-purpose computer.

Block 610 comprises receiving input into a subsystem of the integrated circuit. The subsystem may be any distinct block or group of hardware-implemented logic, and may optionally comprise or be coupled to one or more memories. For example, in a network device, the subsystem may implement forwarding logic, prefix matching, packet manipulation, or any other suitable network-related function. Meanwhile, the input may be a data packet or portion thereof, such as an address or other field, header, cell, frame, identifier, and so forth. In an embodiment, the subsystem is an instance of any number of identical or substantially similar subsystems that operate in parallel on similar data. In an embodiment, the subsystem may be a subsystem 320 or 520 as described above, and the input may be input 360 or 560. In other embodiments, the subsystem may take other forms.

Block 620 comprises accessing a delay value for the subsystem. The delay value may be accessed in any suitable manner, such as by input or by reading the delay value from a suitable memory. In an embodiment, the delay value may be part of an array of delay values described by a programmable delay preset for the integrated circuit, such as described elsewhere.

Block 630 comprises delaying execution of the subsystem by an amount corresponding to the delay value. For example, the delay value may be a number of clock ticks of a reference clock for the subsystem. The subsystem may be configured to wait the number of clock ticks indicated by the delay value before beginning execution of its primary logic. For instance, the subsystem may include a digital delay line component configured to loop repeatedly until the number of clock ticks is reached. Or, the delay value may be utilized to determine some other amount of time to wait, such as an amount of time or clock ticks associated with the delay value in a reference table or by a delay function.

Block 640 comprises, after expiration of the delay period, executing the primary logic of the subsystem based on the received input. Execution of the primary logic will generally result in the production of some kind of result, which is then outputted in block 650 to one or more downstream subsystems coupled to the executing subsystem.

If an appropriate delay value has been chosen, the substrate upon which the primary logic is implemented will typically be fast enough to produce the output within an expected time frame, even after the delay of block 630. In some embodiments, however, the speed of one or more of the downstream components also or instead preserves the integrity of the data in spite of the delay in block 630.

Flow 600 illustrates only one of many possible flows for programmatically delaying execution of a subsystem. Other flows may include fewer, additional, or different elements, in varying arrangements.

In an embodiment, flow 600 is executed by each of a plurality of identical or similar subsystems coupled to the same reference clock. Different delay values may be identified for some or even all of these subsystems, meaning some of the subsystems will be delayed longer than others. In an embodiment, repeated performance of flow 600 by multiple subsystems in an integrated circuit may have, among other advantages, the effect of stabilizing the power demands of the integrated circuit, though flow 600 may also be utilized in contexts in which this advantage is not present.

3.2. Identifying an Optimal Preset for a Chip

Figure 7:
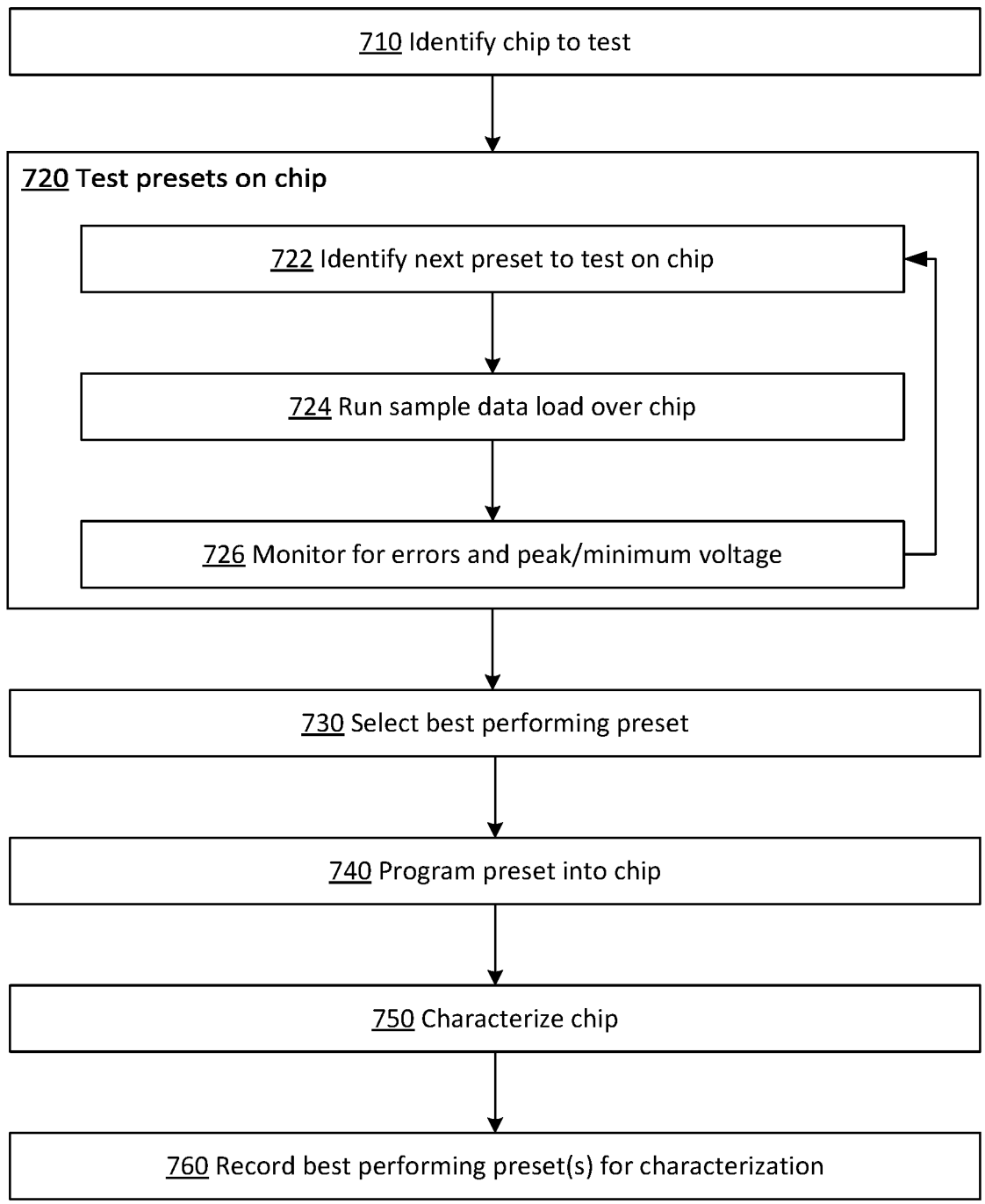
FIG. 7 illustrates an example flow for identifying an optimal preset for a chip implementing an integrated circuit with programmatically delayed subsystems.

FIG. 7 illustrates an example flow 700 for identifying an optimal preset for a chip implementing an integrated circuit with programmatically delayed subsystems, according to an embodiment. Flow 700 may be performed for each fabricated chip, or one or more sample chips may be selected from each of a plurality of groups of chips.

Block 710 comprises identifying the chip to test. The chip may be, for example, a chip upon which integrated circuit 310 or 500 is implemented. Block 720 then comprises testing various presets on the chip. Testing a preset on a chip generally comprises blocks 722-726, which are repeated for each tested preset.

Block 722 comprises identifying a next preset to test on the chip. The tested presets may include each possible combination of delay values for each programmatically delayed subsystem, in which case block 722 simply comprises selecting the next preset from the list of all possible presets.

Or, the presets to test may be selected intelligently. That is, for example, if increasing a certain delay value for a certain subsystem significantly increases the number of data errors relative to a previously tested preset, then all presets that have the certain delay value or higher for the certain subsystem may be ignored. Similarly, if increasing the delay value of a certain subsystem tends to increase peak power, the identification process may back away from increasing the delay value of that certain subsystem. Moreover, the preset testing process may ignore combinations of delay values which would not significantly stagger execution (e.g. setting all or a vast majority of subsystems to the same delay value). Any other suitable optimization may also be utilized to reduce the amount of testing necessary.

Block 724 comprises running a sample data load over the chip. The sample data load may be any suitable data load, though in some embodiments it may be desirable to utilize data loads that closely resemble the data loads that the chip will be expected to process. For example, in an embodiment where the integrated circuit is used to process network traffic, the data load may be network traffic captured from a sample network device.

Block 726 comprises monitoring performance of the integrated circuit. This may comprise, for example, monitoring for data errors, such as may happen when a subsystem is delayed too long in beginning execution of its logic. Monitoring the performance of the integrated circuit may further comprise monitoring the voltage between a voltage regulator and integrated circuit with an ammeter, and recording peak and/or minimum power. Any of a variety of other performance metrics may similarly be monitored.

Block 730 comprises selecting a best performing preset based on the testing of block 720. In an embodiment, the best performing preset is the one that has the lowest peak power relative to all of the presets that did not produce any errors. In an embodiment, a threshold number of errors may be tolerated. In an embodiment, the presets may be ranked in accordance to a formula based on their recorded metrics, and the highest ranked preset may be selected.

Block 740 comprises programming the selected preset into the chip.

Optionally, in block 750, the chip may be characterized by its physical characteristics. For instance, certain silicon die or substrates may be indicated as fast, while others may be indicated as slow. The characterization may be performed using any suitable technique. In embodiment, the characterization is performed by a process monitor ring oscillator. Furthermore, optionally, in block 760, the selected preset may be recorded for the characterization. In an embodiment, other high-performing presets (e.g. the second-ranked preset, third-ranked preset, etc.) may also be recorded and associated with the characterization of the chip.

Flow 700 is but an example of a method for identifying an optimal preset for a chip. Other methods may include additional or fewer steps in varying arrangements. For instance, block 750 may be performed before any other block, or concurrently with other blocks. Moreover, if the chip is solely being used to determine an appropriate preset for a group of chips having the same characterization, block 740 may be optional.

3.3. Programming a Preset Based on Chip Characterization

Figure 8:
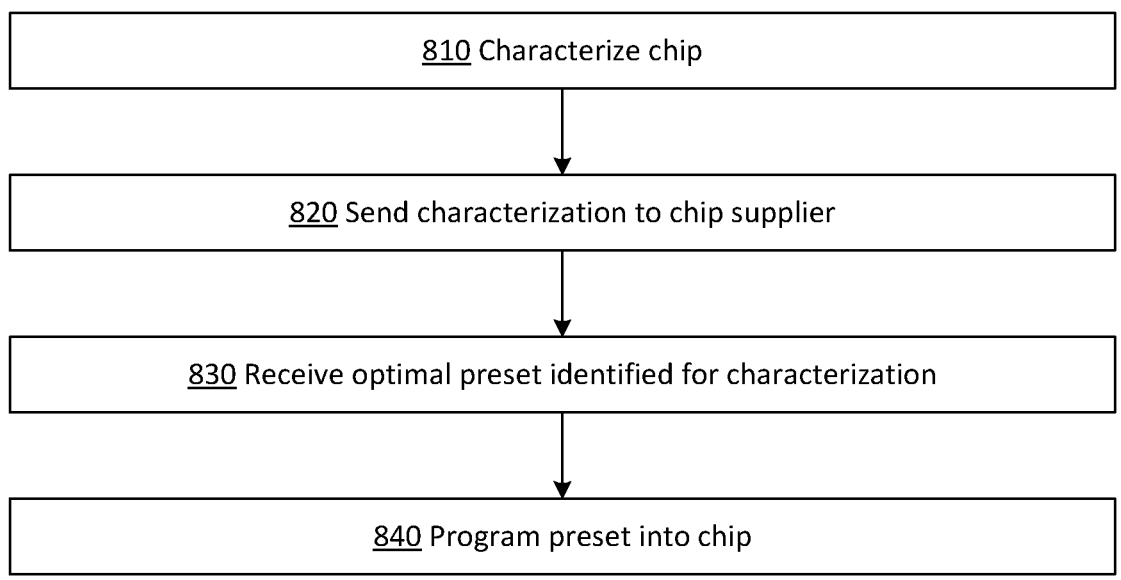
FIG. 8 illustrates an example flow for identifying an optimal preset for a chip based on its characteristics.

FIG. 8 illustrates an example flow 800 for identifying an optimal preset for a chip based on its characteristics, according to an embodiment. Flow 800 may be performed, for example, after the chip has been integrated into a system, or even after the system has been shipped and deployed.

Block 810 comprises characterizing the chip, as explained in block 750 above.

Block 820 comprises sending the determined characterization to the chip supplier. This may involve sending, for example, an identifier and/or characterization data to the supplier by any suitable communication channel.

Block 830 comprises receiving an optimal preset identified for the characterization. Such a preset may have been identified and recorded, for instance, using flow 700.

Block 840 comprises programming the preset into the chip.

Flow 800 may be performed manually by a system engineer or administrator. In an embodiment, flow 800 may alternatively be performed automatically by the system in which the chip is embedded. Of course, other suitable flows for identifying an optimal preset for the chip may be utilized instead.

4.0. Example Embodiments

Examples of some embodiments are represented, without limitation, in the following clauses:

According to an embodiment, an apparatus comprises: one or more memories storing programmable delay values; a subsystem configured to write and/or update the programmable delay values in the one or more memories; and a plurality of programmatically delayable subsystems, each subsystem of the plurality of programmatically delayable subsystems further configured to delay execution by an amount indicated by a programmable delay value assigned to the subsystem in the one or more memories, two or more of the subsystems delaying execution for different amounts of times on account of being assigned different programmable delay values.

In an embodiment, execution of the plurality of programmatically delayable subsystems is staggered based on the programmable delay values, thereby reducing voltage spikes that arise from power demands being aligned between the plurality of programmatically delayable subsystems.

In an embodiment, subsystems implemented on a faster substrate are associated with longer programmable delay values than subsystems implemented on a slower substrate.

In an embodiment, each subsystem in the plurality of programmatically delayable subsystems is configured to execute at least partially concurrently with respect to different data inputs.

In an embodiment, each subsystem is configured to execute at least partially concurrently, and wherein each subsystem is further configured to execute at least substantially similar logic.

In an embodiment, the apparatus further comprises a reference clock configured to provide a clock signal to each of the plurality of programmatically delayable subsystems, the amount of time execution of a given subsystem is delayed being a number of ticks of the reference clock.

In an embodiment, the apparatus further comprises a process monitor ring oscillator configured to characterize a substrate upon which the plurality of programmatically delayable subsystems are implemented, the programmable delay value of each subsystem based in part on a characterization of a specific portion of the substrate upon which the subsystem is implemented.

In an embodiment, each subsystem of the plurality of programmatically delayable subsystems includes a digital delay line configured to loop until expiration of a number of clock cycles of a reference clock, the number of clock cycles indicated by the programmable delay value associated with the subsystem.

In an embodiment, the apparatus is a chip embedded within a network device, the plurality of programmatically delayable subsystems execute at least a portion of the forwarding logic of the network device, and the plurality of programmatically delayable subsystems perform operations on different data inputs, each of the different data inputs being network packets or portions thereof.

In an embodiment, the programmable delay value of each subsystem is no greater than a maximum amount of delay before the subsystem must begin executing in order for data generated based on that execution is expected by a downstream subsystem.

According to an embodiment, a method comprises: at each subsystem of a plurality of subsystems in an integrated circuit, each subsystem being clocked together, each subsystem implementing at least substantially similar logic: receiving a data input; accessing a programmable delay value specific to the subsystem; delaying execution of the logic by a number of clock cycles associated with the programmable delay value; after the delaying, executing the logic on the data input to produce a data output.

In an embodiment, the executing of at least two of the plurality of subsystems is staggered relative to each other, thereby reducing a peak power magnitude of the integrated circuit.

In an embodiment, the method further comprises writing each programmable delay value to one or more memories in the integrated circuit, from which one or more memories they are accessible to their corresponding subsystems.

According to an embodiment, a method comprises: testing different combinations of programmable delay values on a chip implementing an integrated circuit, the integrated circuit comprising subsystems that are configured to delay execution for amounts of time based on programmable delay values assigned to the subsystems; during the testing, monitoring performance of the integrated circuit with respect to one or more metrics; based on the metrics, selecting a particular combination of programmable delay values that meets desired performance criteria; programming the particular combination of programmable delay values into one or more chips implementing the integrated circuit.

In an embodiment, the subsystems are substantially similar or identical.

In an embodiment, the subsystems are clocked together.

In an embodiment, monitoring the performance of the integrated circuit comprises counting data errors.

In an embodiment, monitoring the performance of the integrated circuit comprises recording a peak voltage of the integrated circuit.

In an embodiment, the one or more chips is the tested chip.

In an embodiment, the method further comprising: determining physical characteristics of the chip; wherein the one or more chips include bins of chips having similar physical characteristics as the chip.

Other examples of these and other embodiments are found throughout this disclosure.

5.0. Example Implementation Mechanism 5.1. Network System

Figure 9:
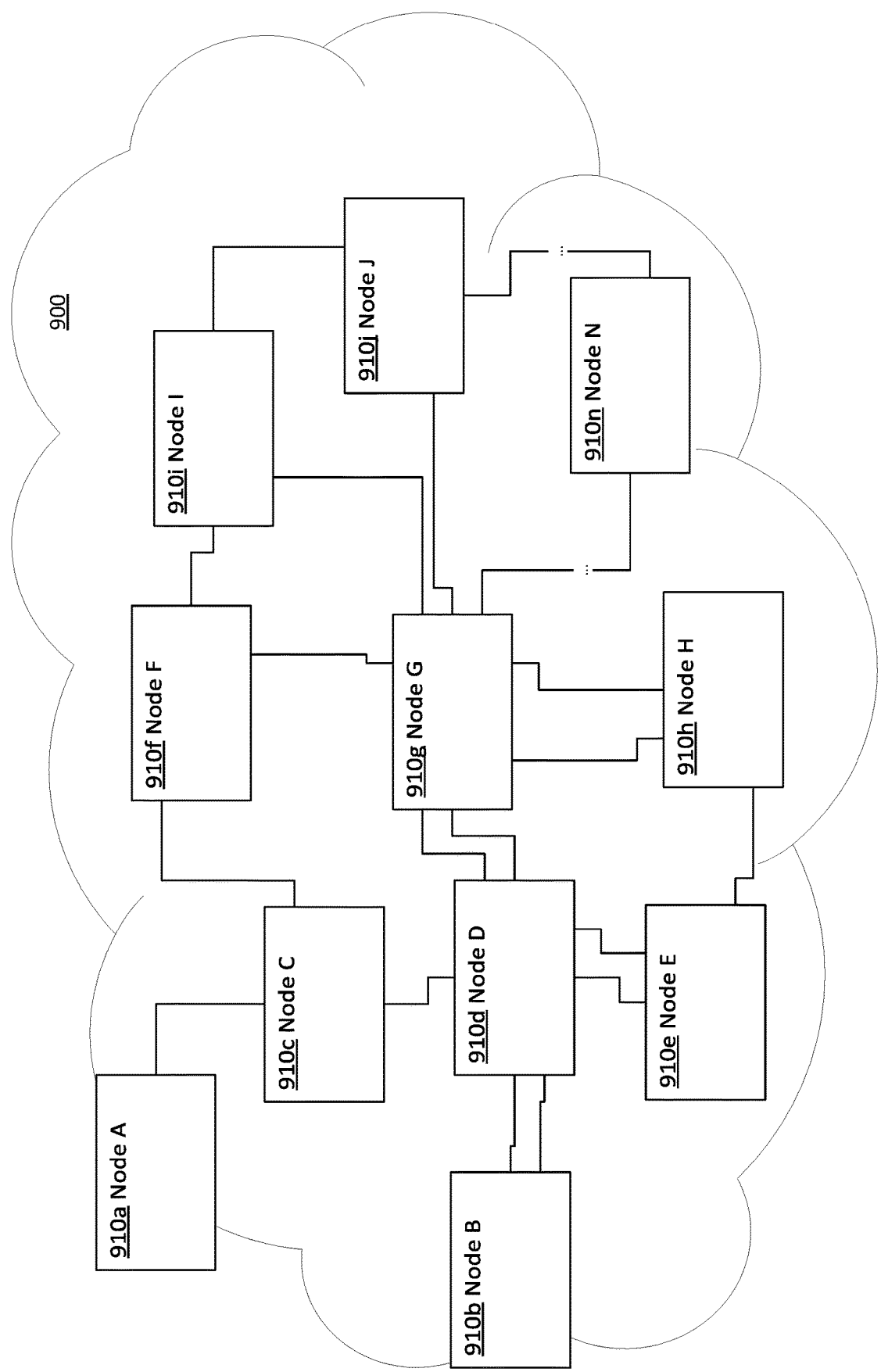
FIG. 9 is an illustrative view of various aspects of an example networking system in which the techniques described herein may be practiced.

FIG. 9 is an illustrative view of various aspects of an example networking system 900, also referred to as a network, in which the techniques described herein may be practiced, according to an embodiment. Networking system 900 comprises a plurality of interconnected nodes 910a-910n (collectively nodes 910), each implemented by a different computing device. In an embodiment, each node may comprise a system 300.

For example, a node 910 may be a single networking computing device, such as a router or switch, in which some or all of the processing components described herein are implemented using application-specific integrated circuits (ASICs) or field programmable gate arrays (FPGAs). As another example, a node 910 may include one or more memories storing instructions for implementing various components described herein, one or more hardware processors configured to execute the instructions stored in the one or more memories, and various data repositories in the one or more memories for storing data structures utilized and manipulated by the various components.

Each node 910 is connected to one or more other nodes 910 in network 900 by one or more communication links, depicted as lines between nodes 910. The communication links may be any suitable wired cabling or wireless links. Note that system 900 illustrates only one of many possible arrangements of nodes within a network. Other networks may include fewer or additional nodes 910 having any number of links between them.

NETWORK PACKETS

While each node 910 may or may not have a variety of other functions, in an embodiment, each node 910 is configured to send, receive, and/or relay data to one or more other nodes 910 via these links. In general, data is communicated as series of discrete units or structures of data represented by signals transmitted over the communication links.

Different nodes 910 within a network 900 may send, receive, and/or relay data units at different communication levels, or layers. For instance, a first node 910 may send a data unit at the network layer (e.g. a TCP segment) to a second node 910 over a path that includes an intermediate node 910. This data unit 910 will be broken into smaller data units ("subunits") at various sublevels before it is transmitted from the first node 910. For example, the data unit may be broken into packets, then cells, and eventually sent out as a collection of signal-encoded bits to the intermediate device. Depending on the network type and/or the device type of the intermediate node 910, the intermediate node 910 may rebuild the entire original data unit before routing the information to the second node 910, or the intermediate node 910 may simply rebuild the subunits (e.g. packets or frames) and route those subunits to the second node 910 without ever composing the entire original data unit.

When a node 910 receives a data unit, it typically examines addressing information within the data unit (and/or other information within the data unit) to determine how to process the data unit. The addressing information may be, for instance, an Internet Protocol (IP) address, MPLS label, or any other suitable information. If the addressing information indicates that the receiving node 910 is not the destination for the data unit, the node may look up the destination node 910 within receiving node's routing information and route the data unit to another node 910 connected to the receiving node 910 based on forwarding instructions associated with the destination node 910 (or an address group to which the destination node belongs). The forwarding instructions may indicate, for instance, an outgoing port over which to send the packet, a label to attach the packet, etc. In cases where multiple paths to the destination node 910 are possible, the forwarding instructions may include information indicating a suitable approach for selecting one of those paths, or a path deemed to be the best path may already be defined.

Addressing information, flags, labels, and other metadata used for determining how to handle a data unit is typically embedded within a portion of the data unit known as the header. The header is typically at the beginning of the data unit, and is followed by the payload of the data unit, which is the information actually being sent in the data unit. A header is typically comprised of fields of different types, such as a destination address field, source address field, destination port field, source port field, and so forth. In some protocols, the number and the arrangement of fields may be fixed. Other protocols allow for arbitrary numbers of fields, with some or all of the fields being preceded by type information that explains to a node the meaning of the field.

A traffic flow is a sequence of data units, such as packets, from a source computer to a destination. In an embodiment, the source of the traffic flow may mark each data unit in the sequence as a member of the flow using a label, tag, or other suitable identifier within the data unit. In another embodiment, the flow is identified by deriving an identifier from other fields in the data unit (e.g. a "five-tuple" combination of a source address, source port, destination address, destination port, and protocol). A flow is often intended to be sent in sequence, and network devices are therefore typically configured to send all data units within a given flow along a same path to ensure that the flow is received in sequence.

For convenience, many of the techniques described in this disclosure are described with respect to routing IP packets in an L3 (level 3) network, in which context the described techniques have particular advantages. It will be recognized, however, that these techniques may also be applied to realize advantages in routing other types of data units conforming to other protocols and/or at other communication layers within a network. Thus, unless otherwise stated or apparent, the term "packet" as used herein should be understood to refer to any type of data structure communicated across a network, including packets as well as segments, cells, data frames, datagrams, and so forth.

NETWORK PATHS

Any node in the depicted network 900 may communicate with any other node in the network 900 by sending packets through a series of nodes 910 and links, referred to as a path. For example, Node B (910*b*) may send packets to Node H (910*h*) via a path from Node B to Node D to Node E to Node H. There may be a large number of valid paths between two nodes. For example, another path from Node B to Node H is from Node B to Node D to Node G to Node H.

In an embodiment, a node 910 does not actually need to specify a full path for a packet that it sends. Rather, the node 910 may simply be configured to calculate the best path for the packet out of the device (e.g. which egress port it should send the packet out on). When a node 910 receives a packet that is not addressed directly to the node 910, based on header information associated with a packet, such as path and/or destination information, the node 910 relays the packet along to either the destination node 910, or a "next hop" node 910 that the node 910 calculates is in a better position to relay the packet to the destination node 910. In this manner, the actual path of a packet is product of each node 910 along the path making routing decisions about how best to move the packet along to the destination node 910 identified by the packet.

5.2. Network Device

Figure 10:
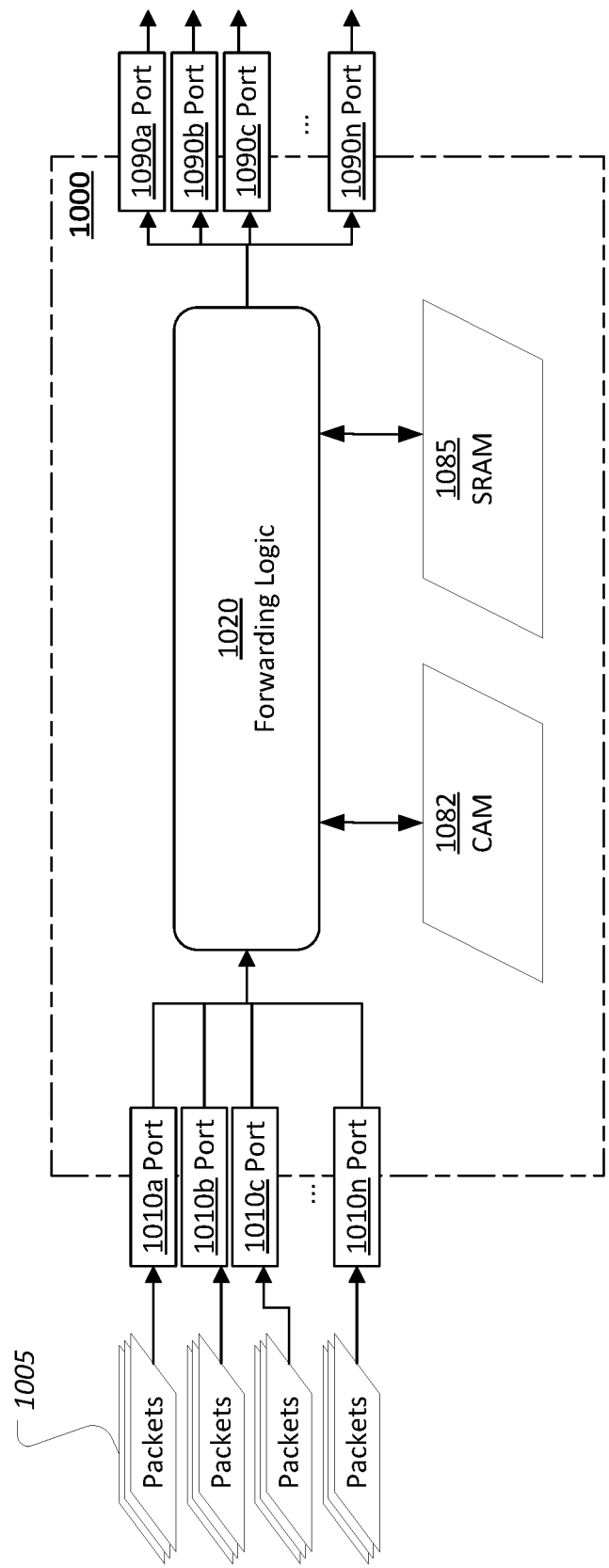
FIG. 10 is an illustrative view of various aspects of an example network device in which techniques described herein may be practiced.

FIG. 10 is an illustrative view of various aspects of an example network device 1000 in which techniques described herein may be practiced, according to an embodiment. Network device 1000 is a computing device comprising any combination of hardware and software configured to implement the various logical components described herein, including components 1010-1090. Note that, in an embodiment, some or all of the nodes 910 in system 900 may each be a separate network device 1000 comprising a system 300.

PORTS

Network device 1000 includes ports 1010/1090. Ports 1010, including ports 1010*a*-*n*, are inbound ("ingress") ports by which data units referred to herein as packets 1005 are received over a network, such as network 900. Ports 1090, including ports 1090*a*-*n*, are outbound ("egress") ports by which at least some of the packets 1005 are sent out to other destinations within the network, after having been processed by the network device 1000. Note that, in embodiments where system 300 is, or is embedded within, network device 1000, input data 360 may in many cases be packets 1005, or portions of packets 1005, such as headers, fields, cells, frames, and so forth.

Ports 1010/1090 are depicted as separate ports for illustrative purposes, but may actually correspond to the same physical hardware ports on the network device 1010. That is, a network device 1000 may both receive packets 1005 and send packets 1005 over a single physical port, and the single physical port may thus function as both an ingress port 1010 and egress port 1090. Nonetheless, for various functional purposes, certain logic of the network device 1000 may view a single physical port as a separate ingress port 1010 and egress port 1090. Moreover, for various functional purposes, certain logic of the network device 1000 may subdivide a single ingress port 1010 or egress port 1090 into multiple ingress ports 1010 or egress ports 1090, or aggregate multiple ingress ports 1010 or multiple egress ports 1090 into a single ingress port 1010 or egress port 1090. Hence, in various embodiments, ports 1010 and 1090 should be understood as distinct logical constructs that are mapped to physical ports rather than simply as distinct physical constructs.

TRAFFIC MANAGEMENT

Since not all packets 1005 received by the device 1000 can be processed at the same time, device 1000 may store packets 1005 in temporary memory structures referred to as buffers while the packets 1005 are waiting to be processed. For example, the device's forwarding logic 1020 may only be capable of processing a certain number of packets 1005, or portions of packets 1005, in a given clock cycle, meaning that other packets 1005, or portions of packets 1005, must either be ignored (i.e. dropped) or stored. At any given time, a large number of packets 1005 may be stored in the buffers of the device 1000, depending on network traffic conditions.

A buffer may be a portion of any type of memory, including volatile memory and/or non-volatile memory. For instance, in an embodiment, buffers may be stored in one or more SRAMs 1086. Device 1000 includes a buffer manager configured to manage use of buffers by device 1000. Among other processing tasks, the buffer manager may, for example, allocate and deallocate specific segments of memory for buffers, create and delete buffers within that memory, identify available buffer(s) in which to store a newly received packet 1005, maintain a mapping of buffers to packets 1005 stored in those buffers (e.g. by a packet sequence number assigned to each packet 1005 as the packet 1005 is received), mark a buffer as available when a packet 1005 stored in that buffer is dropped or sent from the device 1000, determine when to drop a packet 1005 instead of storing the packet 1005 in a buffer, and so forth.

A packet 1005, and the buffer(s) in which it is stored, is said to belong to a construct referred to as a queue. A queue may be a distinct, continuous portion of the memory in which buffers are stored. Or, a queue may instead be a set of linked memory locations (e.g. linked buffers). In some embodiments, the number of buffers assigned to a given queue at a given time may be limited, either globally or on a per-queue basis, and this limit may change over time.

The forwarding logic 1020 of device 1000 may process a packet 1005 over one or more stages. A node may have many queues, and each stage of processing may utilize one or more of the queues to regulate which packet 1005 is processed at which time. To this end, a queue arranges its constituent packets 1005 in a sequence, such that each packet 1005 corresponds to a different node in an ordered series of nodes. The sequence in which the queue arranges its constituent packets 1005 generally corresponds to the sequence in which the packets 1005 in the queue will be processed.

FORWARDING LOGIC

A device 1000 comprises one or more packet processing components that collectively implement forwarding logic 1020 by which the device 1000 is configured to determine how to handle each packet the device 1000 receives. These packet processing components may include, for instance, the various subsystems in integrated circuit 310, including sets of identical or substantially similar subsystems 320. Forwarding logic 1020, or portions thereof, may, in some instances, be hard-coded. For instance, specific hardware or software within the node may be configured to always react to certain types of data units in certain circumstances in a certain way. Forwarding logic 1020, or portions thereof, may also be configurable, in that the logic 1020 changes over time in response to data collected from or instructions received from other nodes in the network in which the device 1000 is located.

For example, a device 1000 will typically store in its memories one or more forwarding tables (or equivalent structures) that map certain data unit attributes or characteristics to actions to be taken with respect to data units having those attributes or characteristics, such as sending the data unit to a selected path, or processing the data unit using a specified internal component. For example, such attributes or characteristics may include a Quality-of-Service level specified by the data unit or associated with another characteristic of the data unit, a flow control group, an ingress port 1010 through which the data unit was received, a tag or label in the packet's header, a source address, a destination address, a packet type, or any other suitable distinguishing property.

In an embodiment, forwarding logic 1020 may read port state data. Port state data may include, for instance, flow control state information describing various traffic flows and associated traffic flow control rules or policies, link status information indicating links that are up or down, port utilization information indicating how ports are being utilized (e.g. utilization percentages, utilization states, etc.). Forwarding logic 1020 may be configured to implement the associated rules or policies associated with the flow(s) to which a given packet belongs.

Forwarding logic 1020 may process a data unit over multiple stages. At each stage, the data unit is placed in a buffer, which is said to belong to a queue. A device 1000 may have many queues, and each stage of processing may utilize one or more of the queues. At any given processing stage, one or more packet processing components, such as a Field Programmable Gate Array (FPGA), Application-Specific Integrated Circuit (ASIC), or a general purpose processor executing software-based instructions, reads data units from associated queues and determines how to handle the data units.

In an embodiment, different queues may exist for different destinations. For example, each port 1010 and/or port 1090 may have its own set of queues. The queue to which an incoming packet 1005 is assigned may therefore be selected based on the port 1010 through which it was received, while the queue to which an outgoing packet is assigned may be selected based on forwarding information indicating which port 1090 the packet should depart from. A different packet processor may be associated with each different set of one or more queues. Hence, the current processing context of the packet 1005 may be used to select which queue a packet 1005 should be assigned to.

In an embodiment, there may also or instead be different queues for different flows or sets of flows. That is, each identifiable traffic flow or group of traffic flows is assigned its own set of queues to which its packets 1005 are respectively assigned. In an embodiment, different queues may correspond to different classes of traffic or quality-of-service (QoS) levels. Different queues may also or instead exist for any other suitable distinguishing property of the packets 1005, such as source address, destination address, packet type, and so forth.

For instance, a data unit may be forwarded to another queue associated with another processing stage implemented by another set of processing components, sent out of the device 1000 over an outbound port 1090, discarded, delayed for flow control reasons, and so forth. The collective actions of these processing components over these multiple stages is said to implement the forwarding logic of the device 1000.

In the course of processing a packet 1005, a device 1000 may replicate a packet 1005 one or more times. For example, a packet 1005 may be replicated for purposes such as multicasting, mirroring, debugging, and so forth. Thus, a single packet 1005 may be replicated to multiple queues. Hence, though certain techniques described herein may refer to the original packet 1005 that was received by the device 1000, it will be understood that those techniques will equally apply to copies of the packet 1005 that have been generated for various purposes.

As data units are routed through different nodes in a network, the nodes may, on occasion, discard, fail to send, or fail to receive data units, thus resulting in the data units failing to reach their intended destination. The act of discarding of a data unit, or failing to deliver a data unit, is typically referred to as "dropping" the data unit. Instances of dropping a data unit, referred to herein as "drops" or "packet loss," may occur for a variety of reasons, such as resource limitations, errors, or deliberate policies.

FORWARDING TABLE

According to an embodiment, forwarding logic 1020 reads certain instructions for handling network traffic from one or more forwarding tables. Generally, forwarding tables describe groups of one or more addresses, such as subnets of IPv4 or IPv6 addresses. Each address is an address of a network device on a network, though a network device may have more than one address. Each group is associated with a potentially different set of one or more actions to execute with respect to data units that resolve to (e.g. are directed to)

an address within the group. Any suitable set of one or more actions may be associated with a group of addresses, including without limitation, forwarding a message to a specified "next hop," duplicating the message, changing the destination of the message, dropping the message, performing debugging or statistical operations, applying a quality of service policy or flow control policy, and so forth. In an embodiment, some or all of the stages of packet processing may have different forwarding tables specifying, for a given group of addresses, one or more instructions relevant to the stage.

For illustrative purposes, these tables are described as "forwarding tables," though it will be recognized that the extent of the action(s) described by tables may be much greater than simply where to forward the message. For example, in an embodiment, a table may be a basic forwarding table that simply specifies a next hop for each group. In other embodiments, a table may describe one or more complex policies for each group. Moreover, there may be different types of tables for different purposes. For instance, one table may be a basic forwarding table that is compared to the destination address of each packet, while another table may specify policies to apply to packets upon ingress based on their destination (or source) group, and so forth. In an embodiment, some or all of forwarding tables may be stored in one or more CAMs 1082. In another embodiment, a forwarding table may be stored at least partially in a SRAM 1086 or other type of memory.

In an embodiment, system 1000 comprises path management control logic that is configured to adjust the forwarding instructions described by forwarding table based on a variety of factors. For example, path management control logic may be configured to recognize administrative commands that explicitly instruct the path management control logic to add or remove address groups or adjust existing instructions for a group. Such commands may originate from components that are external to system 1000, such as from a system administrator or an administrative device. Such commands may also or instead originate from components that are internal to system 1000. Path management control logic may also adjust forwarding instructions in response to events that imply changes to the forwarding instructions, such as the receipt of data units that announce the availability of new paths in a network, the dropping of a certain number of packets to a destination, the application of certain flow control measures, or any other suitable event.

PREFIXES

In an embodiment, groups of addresses are described using an address prefix. This prefix is, in essence, a beginning address portion that is common to each address in the group. The beginning address portion may be, for instance, a first number of bits, bytes, or other element. As used herein, a "prefix entry" generally refers to a data entry (i.e. in a forwarding table) which maps a particular prefix to one or more actions to be performed with respect to network packets or other data structures associated with an input key (e.g. address) that matches the particular prefix. Thus, when determining how to handle a certain packet, forwarding logic 1020 may determine a group of addresses that a data packet is associated with (e.g. a destination subnet, source subnet, etc.) using a prefix, and perform the one or more actions associated with that group.

For example, in the case of IP prefixes, a "slash notation", such as Classless Inter-Domain Routing (CIDR) notation, may be used to express a portion of an IP address that constitutes a prefix portion of the IP address. One example IP prefix may be expressed as "10.172.0.0/16", for instance, where the "/16" syntax indicates that the first 16 bits of the IP address 10.172.0.0 (corresponding to the "10.172" portion) are used to perform matches. The remaining 16 bits of the IP address 10.172.0.0 (the "0.0" portion) is treated as an arbitrary placeholder that is not used for matching. The prefix "10.172.0.0/16" thus matches the IP address "10.172.23.1" because the first 16 bits of both the prefix and IP address, when represented in bit form, are the same, but the same prefix does not match the IP address "10.170.3.28". In other words, a prefix matches an address if the address (when represented as a sequence of bits) begins with the prefix.

Multiple prefix entries may match the same network address. For example, a particular set of IP prefix entries stored by a networking device may include a first prefix entry specifying the prefix "178.0.0.0/8" and a second prefix entry specifying the prefix "178.132.2.0/24." The IP address "178.132.2.11" would match both of these prefixes. In instances where multiple prefix entries match a particular network address, forwarding logic 1020 is generally configured to perform only the action(s) associated with the prefix entry specifying the longest prefix (i.e. the more specific prefix). This longest prefix is referred to as a longest prefix match. For instance, in this case, 178.132.2.0/24 is the longest prefix match for 178.132.2.11.

Forwarding logic 1020 uses a longest prefix matching ("LPM") algorithm to locate the longest prefix match. At a high level, a longest prefix matching algorithm receives an input "key," often comprising a string, list, or array of numbers, characters, or bits, and determines which prefix from a set of prefixes is the longest prefix matching the input key. A prefix "matches" an input key for the purposes of a longest prefix match algorithm if the input key begins with the prefix. Using an example of an input key and set of prefixes that each comprise a string of letters, each of the prefixes "a", "axj", and "axjiiab" matches a hypothetical input key "axjiiabpo", whereas the prefixes "axy", "bxji", and "xjiiab" do not match the input key. The longest prefix match is the longest prefix that matches the input key.

A table that maps different prefixes to different data entries is referred to herein as a prefix table. In an embodiment, a forwarding table may be a prefix table, in that it matches IPv4 or IPv6 prefixes to forwarding instructions, policies, or other data.

In an embodiment, at least some sets of subsystems 320 execute prefix matching algorithms (e.g. against a forwarding table implemented in TCAM or another suitable memory).

5.3. Computer Hardware Overview

According to one embodiment, the techniques described herein are implemented by one or more special-purpose computing devices. The special-purpose computing devices may be desktop computer systems, portable computer systems, handheld devices, networking devices, or any other device that incorporates hard-wired and/or program logic to implement the techniques. The special-purpose computing devices may be hard-wired to perform the techniques, or may include digital electronic devices such as one or more application-specific integrated circuits (ASICs) or field programmable gate arrays (FPGAs) that are persistently programmed to perform the techniques. Such special-purpose computing devices may also combine custom hard-wired logic, ASICs, or FPGAs with custom programming to accomplish the techniques.

Though the foregoing techniques are described with respect to a hardware implementation, which provides a number of advantages in certain embodiments, it will also be recognized that, in another embodiment, the foregoing techniques may still provide certain advantages when performed partially or wholly in software. Accordingly, in such an embodiment, a suitable implementing apparatus comprises a general-purpose hardware processor and is configured to perform any of the foregoing methods by executing program instructions in firmware, memory, other storage, or a combination thereof.

Figure 11:
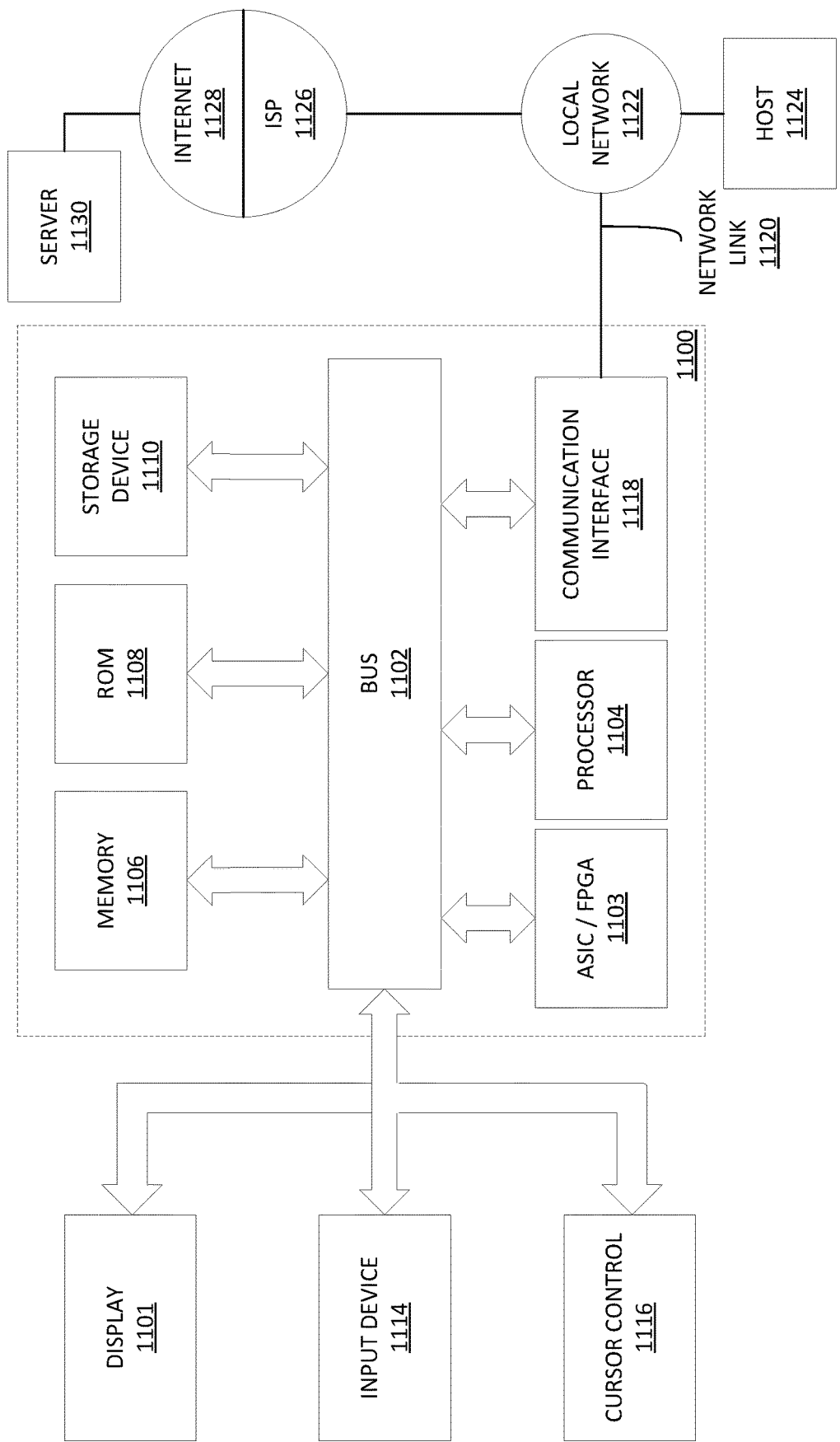
FIG. 11 is a block diagram that illustrates a computer system that may be utilized in implementing the above-described techniques.

FIG. 11 is a block diagram that illustrates a computer system 1100 that may be utilized in implementing the above-described techniques, according to an embodiment. Computer system 1100 may be, for example, a desktop computing device, laptop computing device, tablet, smartphone, server appliance, computing mainframe, multimedia device, handheld device, networking apparatus, or any other suitable device.

Computer system 1100 may include one or more ASICs, FPGAs, or other specialized circuitry 1103 for implementing logic as described herein. For example, circuitry 1103 may include fixed and/or configurable hardware logic blocks for implementing some or all of the described techniques, input/output (110) blocks, hardware registers or other embedded memory resources such as random access memory (RAM) for storing various data, and so forth. The logic blocks may include, for example, arrangements of logic gates, flip-flops, multiplexers, and so forth, configured to generate an output signals based on logic operations performed on input signals. Circuitry 1103 may include, for instance, integrated circuit 310 and/or system 500.

Additionally, computer system 1100 may include one or more hardware processors 1104 configured to execute software-based instructions. Computer system 1100 may also include one or more busses 1102 or other communication mechanism for communicating information. Busses 1102 may include various internal and/or external components, including, without limitation, internal processor or memory busses, a Serial ATA bus, a PCI Express bus, a Universal Serial Bus, a HyperTransport bus, an Infiniband bus, and/or any other suitable wired or wireless communication channel.

Computer system 1100 also includes one or more memories 1106, such as a RAM, hardware registers, or other dynamic or volatile storage device for storing data units to be processed by the one or more ASICs, FPGAs, or other specialized circuitry 1103. Memory 1106 may also or instead be used for storing information and instructions to be executed by processor 1104. Memory 1106 may be directly connected or embedded within circuitry 1103 or a processor 1104. Or, memory 1106 may be coupled to and accessed via bus 1102. Memory 1106 also may be used for storing temporary variables, data units describing rules or policies, or other intermediate information during execution of program logic or instructions.

Computer system 1100 further includes one or more read only memories (ROM) 1108 or other static storage devices coupled to bus 1102 for storing static information and instructions for processor 1104. One or more storage devices 1110, such as a solid-state drive (SSD), magnetic disk, optical disk, or other suitable non-volatile storage device, may optionally be provided and coupled to bus 1102 for storing information and instructions.

A computer system 1100 may also include, in an embodiment, one or more communication interfaces 1118 coupled to bus 1102. A communication interface 1118 provides a data communication coupling, typically two-way, to a network link 1120 that is connected to a local network 1122. For example, a communication interface 1118 may be an integrated services digital network (ISDN) card, cable modem, satellite modem, or a modem to provide a data communication connection to a corresponding type of telephone line. As another example, the one or more communication interfaces 1118 may include a local area network (LAN) card to provide a data communication connection to a compatible LAN. As yet another example, the one or more communication interfaces 1118 may include a wireless network interface controller, such as a 1102.11-based controller, Bluetooth controller, Long Term Evolution (LTE) modem, and/or other types of wireless interfaces. In any such implementation, communication interface 1118 sends and receives electrical, electromagnetic, or optical signals that carry digital data streams representing various types of information.

Network link 1120 typically provides data communication through one or more networks to other data devices. For example, network link 1120 may provide a connection through local network 1122 to a host computer 1124 or to data equipment operated by a Service Provider 1126. Service Provider 1126, which may for example be an Internet Service Provider (ISP), in turn provides data communication services through a wide area network, such as the world wide packet data communication network now commonly referred to as the "Internet" 1128. Local network 1122 and Internet 1128 both use electrical, electromagnetic or optical signals that carry digital data streams. The signals through the various networks and the signals on network link 1120 and through communication interface 1118, which carry the digital data to and from computer system 1100, are example forms of transmission media.

In an embodiment, computer system 1100 can send packets and receive data through the network(s), network link 1120, and communication interface 1118. In some embodiments, this data may be data units that the computer system 1100 has been asked to process and, if necessary, redirect to other computer systems via a suitable network link 1120. In other embodiments, this data may be instructions for implementing various processes related to the described techniques. For instance, in the Internet example, a server 1130 might transmit a requested code for an application program through Internet 1128, ISP 1126, local network 1122 and communication interface 1118. The received code may be executed by processor 1104 as it is received, and/or stored in storage device 1110, or other non-volatile storage for later execution. As another example, information received via a network link 1120 may be interpreted and/or processed by a software component of the computer system 1100, such as a web browser, application, or server, which in turn issues instructions based thereon to a processor 1104, possibly via an operating system and/or other intermediate layers of software components.

Computer system 1100 may optionally be coupled via bus 1102 to one or more displays 117 for presenting information to a computer user. For instance, computer system 1100 may be connected via an High-Definition Multimedia Interface (HDMI) cable or other suitable cabling to a Liquid Crystal Display (LCD) monitor, and/or via a wireless connection such as peer-to-peer Wi-Fi Direct connection to a Light-Emitting Diode (LED) television. Other examples of suitable types of displays 117 may include, without limitation, plasma display devices, projectors, cathode ray tube (CRT) monitors, electronic paper, virtual reality headsets, braille terminal, and/or any other suitable device for outputting information to a computer user. In an embodiment, any suitable type of output device, such as, for instance, an audio speaker or printer, may be utilized instead of a display 117.

One or more input devices 1114 are optionally coupled to bus 1102 for communicating information and command selections to processor 1104. One example of an input device 1114 is a keyboard, including alphanumeric and other keys. Another type of user input device 1114 is cursor control 1116, such as a mouse, a trackball, or cursor direction keys for communicating direction information and command selections to processor 1104 and for controlling cursor movement on display 117. This input device typically has two degrees of freedom in two axes, a first axis (e.g., x) and a second axis (e.g., y), that allows the device to specify positions in a plane. Yet other examples of suitable input devices 1114 include a touch-screen panel affixed to a display 117, cameras, microphones, accelerometers, motion detectors, and/or other sensors. In an embodiment, a network-based input device 1114 may be utilized. In such an embodiment, user input and/or other information or commands may be relayed via routers and/or switches on a Local Area Network (LAN) or other suitable shared network, or via a peer-to-peer network, from the input device 1114 to a network link 1120 on the computer system 1100.

As discussed, computer system 1100 may implement techniques described herein using customized hard-wired logic, one or more ASICs or FPGAs 1103, firmware and/or program logic, which in combination with the computer system causes or programs computer system 1100 to be a special-purpose machine. According to one embodiment, however, the techniques herein are performed by computer system 1100 in response to processor 1104 executing one or more sequences of one or more instructions contained in main memory 1106. Such instructions may be read into main memory 1106 from another storage medium, such as storage device 1110. Execution of the sequences of instructions contained in main memory 1106 causes processor 1104 to perform the process steps described herein.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 1110. Volatile media includes dynamic memory, such as main memory 1106. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1102. Transmission media can also take the form of acoustic or light waves, such as those generated during radio-wave and infra-red data communications.

Various forms of media may be involved in carrying one or more sequences of one or more instructions to processor 1104 for execution. For example, the instructions may initially be carried on a magnetic disk or solid state drive of a remote computer. The remote computer can load the instructions into its dynamic memory and use a modem to send the instructions over a network, such as a cable network or cellular network, as modulated signals. A modem local to computer system 1100 can receive the data on the network and demodulate the signal to decode the transmitted instructions. Appropriate circuitry can then place the data on bus 1102. Bus 1102 carries the data to main memory 1106, from which processor 1104 retrieves and executes the instructions. The instructions received by main memory 1106 may optionally be stored on storage device 1110 either before or after execution by processor 1104.

6.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the inventive subject matter have been described with reference to numerous specific details that may vary from implementation to implementation. Thus, the sole and exclusive indicator of what is the inventive subject matter, and is intended by the applicants to be the inventive subject matter, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A network switching apparatus comprising:
one or more memories storing programmable delay values;

a delay setting subsystem configured to write and/or update the programmable delay values in the one or more memories;

network communication interfaces configured to communicate with a plurality of network devices; and a plurality of packet processing subsystems configured to operate in parallel with respect to a common reference clock signal, said operating including, by each subsystem of the plurality of packet processing subsystems, inputting one or more respective network packets among packets received via the network communication interfaces, processing the one or more respective network packets, and outputting the one or more respective network packets to one or more downstream subsystems, each of the one or more respective network packets including a header and a payload, each packet processing subsystem of the plurality of packet processing subsystems further comprising:

a delay-inducing component delaying, relative to the reference clock signal, at least the processing of the one or more respective network packets by an amount indicated by a programmable delay value assigned to the subsystem in the one or more memories, the amount by which the processing is delayed being the same for all packets processed by the subsystem until the programmable delay value is updated, two or more of the subsystems delaying the processing of their one or more respective network packets for different amounts of times on account of being assigned different programmable delay values;

wherein the delay setting subsystem sets the programmable delay value for the packet processing subsystem, the programmable delay value being selected based at least in part on one or more substrate properties of one or more integrated circuits included in the respective packet processing subsystem.

2. The network switching apparatus of claim 1, wherein execution of the plurality of packet processing subsystems is staggered based on the programmable delay values, thereby reducing voltage spikes that arise from power demands being aligned between the plurality of packet processing subsystems.

3. The network switching apparatus of claim 1, wherein a first packet processing subsystem of the packet processing subsystems that is implemented on a faster substrate is associated with longer programmable delay values than a second packet processing subsystem of the packet processing subsystems that is implemented on a slower substrate.

4. The network switching apparatus of claim 1, wherein each subsystem in the plurality of packet processing subsystems is configured to execute at least partially concurrently with respect to packets received over different network communications with which the packets are associated.

5. The network switching apparatus of claim 1,
wherein the processing of the one or more respective network packets comprises one or more of: manipulating a particular packet, attaching a label to the particular packet, identifying forwarding instructions associated with the particular packet, determining a network flow associated with the particular packet, determining a path for sending the particular packet, dropping the particular packet, replicating the particular packet, or prefix-matching against an address of the particular packet;

wherein the one or more downstream components include one or more of: an outgoing port or a traffic management queue.

6. The network switching apparatus of claim 1, further comprising a reference clock configured to provide the reference clock signal to each of the plurality of packet processing subsystems, the amount of time execution is delayed in a given subsystem of the plurality of packet processing subsystems being a number of ticks of the reference clock.

7. The network switching apparatus of claim 1, further comprising a process monitor ring oscillator configured to characterize a substrate upon which at least a particular packet processing subsystem of the plurality of packet processing subsystems is implemented, a programmable delay value of the particular packet processing subsystem based in part on said characterizing.

8. The network switching apparatus of claim 1, wherein each subsystem of the plurality of packet processing subsystems includes a digital delay line configured to loop until expiration of a number of clock cycles of a reference clock, the number of clock cycles indicated by the programmable delay value associated with the subsystem.

9. The network switching apparatus of claim 1, wherein the packet processing subsystems each include one or more of: a traffic manager or a packet processor.

10. The network switching apparatus of claim 1, wherein the programmable delay value of each subsystem of the plurality of packet processing subsystems is no greater than a maximum amount of delay before the subsystem must begin executing in order for data generated based on that execution is expected by the one or more downstream subsystems.

11. The network switching apparatus of claim 1, wherein processing the one or more respective network packets comprises performing prefix matching against a ternary content addressable memory ("TCAM").

12. A method comprising:
receiving and transmitting packets over one or more network communication interfaces of a network switching apparatus;

sending a reference clock signal to each of a plurality of packet processing subsystems of the network switching apparatus;

at each packet processing subsystem of the plurality of packet processing subsystems in the network switching apparatus:
receiving one or more respective network packets among the packets, each of the one or more respective network packets including a header and a payload;

processing the one or more respective network packets with respect to the reference clock signal;

accessing a programmable delay value specific to the packet processing subsystem, at least two or more of the packet processing subsystems being assigned to different programmable delay values;

delaying, relative to the reference clock signal, execution of processing the one or more respective network packets by a number of clock cycles associated with the programmable delay value, the number of clock cycles being the same for all packets processed by the packet processing subsystem until the programmable delay value is updated, the programmable delay value being selected for the packet processing subsystem based at least in part on one or more substrate properties of one or more integrated circuits included in the respective packet processing subsystem;

after the delaying, performing said processing of the one or more respective network packets;

outputting the processed one or more respective network packets to one or more downstream subsystems.

13. The method of claim 12, further comprising writing each programmable delay value to one or more memories in the network switching apparatus, from which one or more memories they are accessible to their corresponding packet processing subsystems.

14. The method of claim 12, whereby the processing of at least two of the plurality of packet processing subsystems is staggered relative to each other, thereby reducing a peak power magnitude of the network switching apparatus.

15. The method of claim 12, wherein processing the one or more respective network packets comprises one or more of: manipulating a particular packet, attaching a label to the particular packet, identifying forwarding instructions associated with the particular packet, determining a network flow associated with the particular packet, determining a path for sending the particular packet, dropping the particular packet, replicating the particular packet, or prefix-matching against an address of the particular packet;

wherein the one or more downstream components include one or more of: an outgoing port or a traffic management queue.

16. The method of claim 12, wherein the packet processing subsystems each include one or more of: a traffic manager or a packet processor.

17. The method of claim 12, wherein each packet processing subsystem of the plurality of packet processing subsystems is coupled to a different set of the network communication interfaces; and wherein one or more of:

receiving the one or more respective network packets comprises receiving the one or more respective network packets from the set of the network communication interfaces that is coupled to the packet processing subsystem; or outputting the processed one or more respective network packets comprises sending the processed one or more respective network packets out a particular network communication interface in the set of the network communication interfaces that is coupled to the packet processing subsystem.

* * * * *